(12) United States Patent
Sio et al.

(10) Patent No.: US 11,444,073 B2
(45) Date of Patent: Sep. 13, 2022

(54) POWER DISTRIBUTION NETWORK

(71) Applicant: Taiwan Semiconductor Manufacturing Company, Ltd., Hsinchu (TW)

(72) Inventors: Kam-Tou Sio, Zhubei (TW); Jiann-Tyng Tzeng, Hsinchu (TW); Wei-Cheng Lin, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/081,807

(22) Filed: Oct. 27, 2020

(65) Prior Publication Data

US 2022/0130817 A1 Apr. 28, 2022

(51) Int. Cl.
| | |
|---|---|
| *H01L 27/02* | (2006.01) |
| *H01L 21/84* | (2006.01) |
| *H01L 27/12* | (2006.01) |
| *H03K 3/037* | (2006.01) |
| *H01L 27/118* | (2006.01) |

(52) U.S. Cl.
CPC .......... *H01L 27/0207* (2013.01); *H01L 21/84* (2013.01); *H01L 27/12* (2013.01); *H03K 3/037* (2013.01); *H01L 2027/11861* (2013.01); *H01L 2027/11866* (2013.01); *H01L 2027/11887* (2013.01)

(58) Field of Classification Search
CPC ..... H01L 27/0207; H01L 21/84; H01L 27/12; H01L 2027/11861; H01L 2027/11866; H01L 2027/11887; H05K 3/037

USPC .................................. 257/203; 438/128, 129
See application file for complete search history.

(56) References Cited

U.S. PATENT DOCUMENTS

| | | |
|---|---|---|
| 11,296,070 B2 | 4/2022 | Peng et al. |
| 2006/0071319 A1 | 4/2006 | Nishimura |
| 2013/0328069 A1 | 12/2013 | Yang et al. |
| 2017/0154848 A1* | 6/2017 | Fan et al. ............ H01L 23/5286 |
| 2018/0219057 A1 | 8/2018 | Han |
| 2020/0266169 A1 | 8/2020 | Kang et al. |

FOREIGN PATENT DOCUMENTS

| | | |
|---|---|---|
| DE | 10 2020 119 415 A1 | 12/2021 |
| TW | 201351660 A | 12/2013 |

OTHER PUBLICATIONS

Office Action directed to related German Patent Application No. 102020129832.3, dated May 12, 2022; 9 pages.

* cited by examiner

*Primary Examiner* — Thinh T Nguyen
(74) *Attorney, Agent, or Firm* — Sterne, Kessler, Goldstein and Fox P.L.L.C.

(57) ABSTRACT

An integrated circuit includes a first pair of power rails and a second pair of power rails that are disposed in a first layer, conductive lines disposed in a second layer above the first layer, and a first active area disposed in a third layer above the second layer. The first active area is arranged to overlap the first pair of power rails. The first active area is coupled to the first pair of power rails through a first line of the conductive lines and a first group of vias, and the first active area is coupled to the second pair of power rails through at least one second line of the conductive lines and a second group of vias different from the first group of vias.

20 Claims, 17 Drawing Sheets

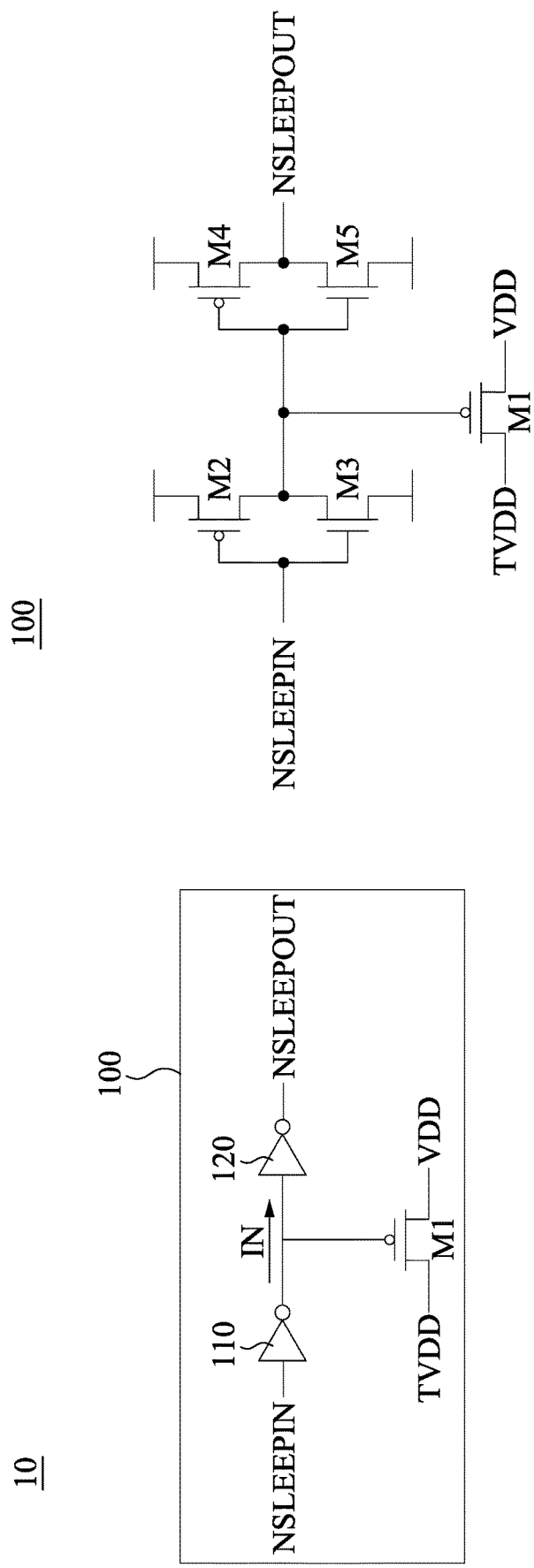

FIG. 12

1210 — FORMING A PLURALITY OF POWER RAILS IN A FIRST LAYER, WHEREIN THE POWER RAILS EXTEND IN A FIRST DIRECTION AND ARE SEPARATED FROM EACH OTHER IN A SECOND DIRECTION

1220 — FORMING A PLURALITY OF CONDUCTIVE LINES IN A SECOND LAYER ABOVE THE FIRST LAYER, WHEREIN THE CONDUCTIVE LINES EXTEND IN THE SECOND DIRECTION; WHEREIN AT LEAST ONE FIRST CONDUCTIVE LINE IS COUPLED TO AT LEAST ONE FIRST POWER RAIL, AND AT LEAST ONE SECOND CONDUCTIVE LINE IS COUPLED TO AT LEAST ONE SECOND POWER RAIL

1230 — FORMING A PLURALITY OF CONDUCTIVE SEGMENTS OVER A PLURALITY OF ACTIVE AREAS IN A THIRD LAYER ABOVE THE SECOND LAYER, WHEREIN A FIRST ACTIVE AREA IS COUPLED TO THE AT LEAST ONE FIRST CONDUCTIVE LINE AND THE AT LEAST ONE SECOND CONDUCTIVE LINE

1240 — FORMING A PLURALITY OF GATES CROSSING THE ACTIVE AREAS AND INTERPOSED BETWEEN THE CONDUCTIVE SEGMENTS

1250 — FORMING A PLURALITY OF CONDUCTIVE TRACES IN A FOURTH LAYER ABOVE THE THIRD LAYER, WHEREIN THE CONDUCTIVE TRACES EXTEND IN THE SECOND DIRECTION

1260 — FORMING A CONDUCTIVE PATTERN IN A FIFTH LAYER ABOVE THE FOURTH LAYER, WHEREIN THE CONDUCTIVE PATTERN IS COUPLED TO TWO CONDUCTIVE TRACES

1200

POWER DISTRIBUTION NETWORK

BACKGROUND

In semiconductor fabrication, integrated circuit scaling can be limited due to critical dimensions associated with the back-end-of-line (BEOL). BEOL scaling has slowed with current semiconductor fabrication processes.

BRIEF DESCRIPTION OF THE DRAWINGS

Aspects of the present disclosure are best understood from the following detailed description when read with the accompanying figures.

FIG. 1A is an equivalent circuit of part of an integrated circuit, in accordance with various embodiments.

FIG. 1B is a transistor representation of the equivalent circuit part of a power gate circuit of FIG. 1A, in accordance with various embodiments.

FIG. 12 is a flow chart of a method of fabricating an integrated circuit, in accordance with various embodiments.

DETAILED DESCRIPTION

Figure 2B:
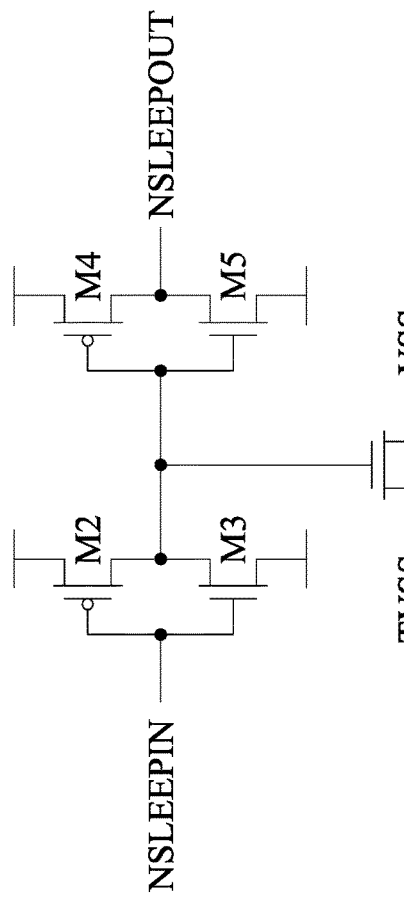
FIG. 2B is a transistor representation of the equivalent circuit part of a power gate circuit of FIG. 2A, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, the term "and/or" includes any and all combinations of one or more of the associated listed items.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is an equivalent circuit of part of an integrated circuit 10, in accordance with various embodiments. As illustratively shown in FIG. 1A, the integrated circuit 10 includes a power gate circuit 100 having inverters 110-120 and a P-type transistor M1. The power gate circuit 100 is configured to be connected to an external power supply (not shown) in order to receive an external voltage, i.e., a voltage TVDD, from the external power supply, for the integrated circuit 10. In response to a signal NSLEEPIN, the power gate circuit 100 is configured to output a supply voltage, i.e., a voltage VDD to a cell circuit (not shown) included in the integrated circuit 10. In some embodiments, the power gate circuit 100 is referred to as a header in the integrated circuit 10.

For illustration, the inverter 110 is configured to invert the signal NSLEEPIN and to output an input signal IN to the inverter 120 and the transistor M1. The inverter 120 is configured to inverter the signal IN to output a signal NSLEEPOUT. In response to the input signal IN received at a gate of the transistor M1, the transistor M1 is configured to output the voltage VDD corresponding to the external voltage TVDD received at a source terminal thereof. In some embodiments, the signal NSLEEPIN has a logic high, i.e., logic 1, and correspondingly, the inverter 110 outputs the input signal IN has a logic low, i.e., logic 0. The transistor M1 is turned on and outputs the supply voltage VDD.

Reference is now made to FIG. 1B. FIG. 1B is a detailed circuit of the equivalent circuit part of the power gate circuit 100 of FIG. 1A, in accordance with various embodiments. As illustratively shown in FIG. 1B, the inverter 110 includes a P-type transistor M2 and an N-type transistor M3. The inverter 120 includes a P-type transistor M4 and an N-type transistor M5. Gates of the transistors M2-M3 are coupled together to receive the signal NSLEEPIN. A first terminal of the transistor M2 is coupled to a first terminal of the transistor M3 at the gate of the transistor M1. Gates of the transistors M4-M6 are coupled together at the gate of the transistor M1. A first terminal of the transistor M4 is coupled to a first terminal of the transistor M5 to output the signal NSLEEPOUT.

Figure 2A:
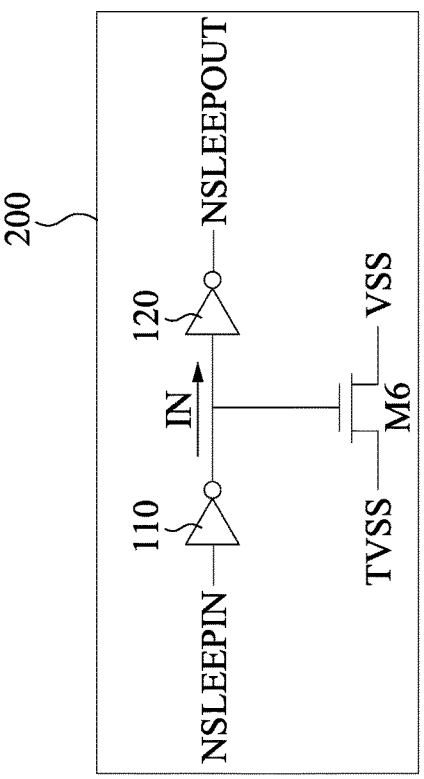
FIG. 2A is an equivalent circuit of part of an integrated circuit, in accordance with various embodiments.

Reference is now made to FIG. 2A. FIG. 2A is an equivalent circuit of part of the integrated circuit 10, in accordance with various embodiments. With respect to the embodiments of FIGS. 1A-1B, like elements in FIG. 2A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 2A.

For illustration, the integrated circuit 10 includes a power gate circuit 200. Compared with the power gate circuit 100 of FIG. 1A, instead of having the P-type transistor M1, the power gate circuit 200 includes an N-type transistor M6. The power gate circuit 200 is configured to be connected to an external power supply (not shown) in order to receive an external voltage, i.e., a voltage TVSS, from the external power supply, for the integrated circuit 10. In response to a signal NSLEEPIN, the power gate circuit 200 is configured to output a supply voltage, i.e., a voltage VSS to a cell circuit (not shown) included in the integrated circuit 10. In some embodiments, the power gate circuit 200 is referred to as a footer in the integrated circuit 10.

Reference is now made to FIG. 2B. FIG. 2B is a detailed circuit of the equivalent circuit part of the power gate circuit 200 of FIG. 2A, in accordance with various embodiments. With respect to the embodiments of FIGS. 1A-2A, like elements in FIG. 2B are designated with the same reference numbers for ease of understanding.

For illustration, in response to the input signal IN received at a gate of the transistor M6, the transistor M6 is configured to output the voltage VSS corresponding to the external voltage TVSS received at a source terminal thereof. In some embodiments, the signal NSLEEPIN has a logic low, i.e., logic 0, and correspondingly, the inverter 110 outputs the input signal IN has a logic high i.e., logic 1. The transistor M6 is turned on and outputs the supply voltage VSS.

The configurations of FIGS. 1A-2B are given for illustrative purposes. Various implements are within the contemplated scope of the present disclosure. For example, in some embodiments, the power gate circuits 100 and 200 do not include the inverters 110-120 and include merely the transistors M1 and M6 respectively.

Figure 3A:
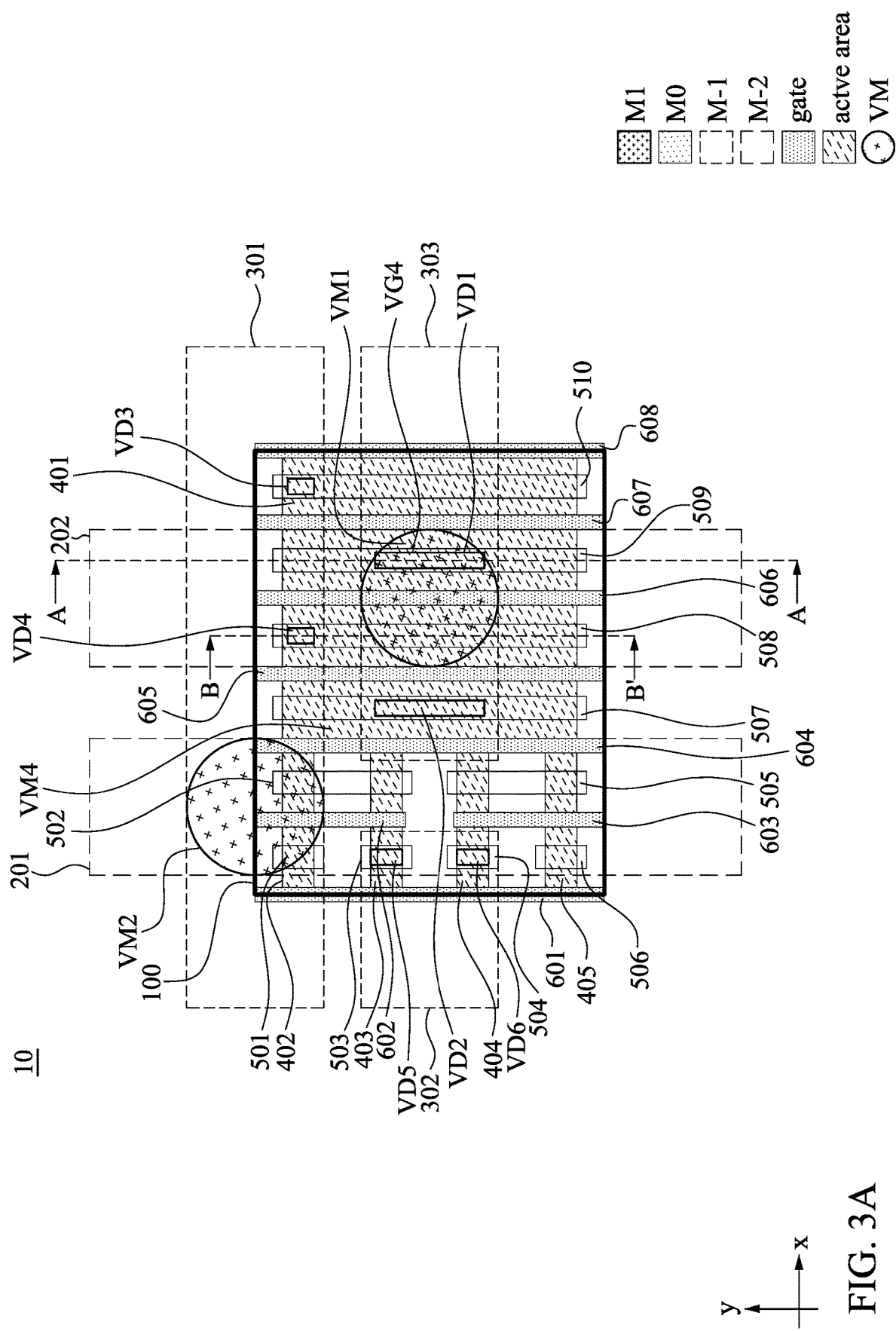
FIG. 3A is a layout diagram in a plan view corresponding to part of the integrated circuit of FIG. 1B, in accordance with various embodiments.

Reference is now made to FIG. 3A. FIG. 3A is a layout diagram in a plan view corresponding to part of the integrated circuit 10 of FIG. 1B, in accordance with various embodiments.

For illustration, as shown in FIG. 3A, the integrated circuit 10 includes power rails 201-202, conductive lines 301-303, active areas 401-405, conductive segments 501-510, gates 601-608, and vias VD1-VD6 and VM1-VM2 on a substrate (not shown). In some embodiments, the power rails 201-202 are disposed in a first layer. The conductive lines 301-303 are disposed in a second layer above the first layer. The active areas 401-405 are disposed in a third layer above the second layer. The conductive lines 501-510 and the gates 601-608 are disposed over the active areas. The vias VM1-VM2 are disposed between the first and second layers. The vias VD1-VD6 are disposed between the second and third layers.

With reference to FIGS. 1B and 3A, the active areas 401-405 are configured in the formation of the transistors M1-M5. The conductive segment 501 corresponds to a second terminal of the transistor M4, and the conductive segment 502 corresponds to the first terminals of the transistors M4-M5. The gate 602 corresponds to the gates of the transistors M4-M5. The conductive segment 503 corresponds to a second terminal of the transistor M5. The conductive segment 504 corresponds to a second terminal of the transistor M3, and the conductive segment 505 corresponds to the first terminals of the transistors M2-M3. The gate 603 corresponds to the gates of the transistors M2-M3. The conductive segment 506 corresponds to a second terminal of the transistor M2. The conductive segments 507 and 509 together correspond to the source of the transistor M1, and the conductive segments 508 and 510 together correspond to a drain of the transistor M1. The gates 605-607 together correspond to the gate of the transistor M1. With the conductive segments 507 and 509 coupled to the source of the transistor M1, the conductive segments 508 and 510 coupled to the drain of the transistor M1, and the gates 605-607 coupled together to form the gate of the transistor M1, transistor M1 can be formed in a parallel configuration based on these elements, according to some embodiments. In some embodiments, the gates 601, 604, and 608 are referred to as dummy gates, in which in some embodiments, the "dummy" gates are referred to as being not electrically connected as the gates for MOS devices, having no function in the circuit.

For illustration, the power rails 201-202 extend in the y-direction and are separated from each other in the x-direction. In some embodiments, the power rail 202 outputs the external voltage TVDD to the power gate circuit 100, and the power rail 201 outputs the supply voltage VDD from the power gate circuit 100. The further detail will be discussed in the following paragraphs. In some embodiments, the power rails 201-202 are referred to as metal-minus-two (M-2) layers.

The conductive lines 301-303 extend in the x-direction and are separated from each other in the y-direction. The conductive lines 302-303 are further separated from each other in the x-direction. In a layout view, the conductive lines 301-303 cross through the power rails 201-202. In some embodiments, the conductive line 303 has a width shorter than that of the conductive line 301. In some embodiments, the conductive lines 301-303 are referred to as metal-minus-one (M-1) layers.

The active areas 401-405 extend in the x-direction. The active areas 402-405 are separated from each other in the y-direction. The active area 401 overlaps the conductive lines 301 and 303. The active area 402 overlaps the conductive line 301. The active areas 403-404 overlap the conductive line 302. In some embodiments, the active area 401 further includes active regions 401a-401d as shown in FIG. 3A.

In some embodiments, the active areas 401-402, and 405 are doped with P-type dopant, such as boron, indium, aluminum, gallium, or a combination thereof. The active areas 403-404 are doped with N-type dopants, such as phosphorus, arsenic, or a combination thereof.

The gates 601-608 extend in the y-direction and are separated from each other in the x-direction. As shown in FIG. 3A, the gate 602 crosses the active areas 402-403. The gate 603 crosses the active areas 404-405. The gates 605-607 cross the active area 401. The gate 604 is disposed between the active area 401 and active areas 402-405.

In some embodiments, each one of the gates 601-608 includes an interfacial layer (not shown) and a polysilicon (or poly) layer (not shown) over the interfacial layer. In some embodiments, the gates 601-608 further include a gate dielectric layer (not shown) and a metal gate layer (not shown) disposed between the interfacial layer and the poly layer. In some embodiments, the gates 601-608 include one or more metal layers in place of the poly layer. In various embodiments, the interfacial layer includes a dielectric material including, for example, silicon oxide ($SiO_2$) or silicon oxynitride (SiON), and is able to be formed by chemical oxidation, thermal oxidation, atomic layer deposition (ALD), chemical vapor deposition (CVD), and/or other suitable methods. In some embodiments, the polysilicon layer is formed by suitable deposition processes including, for example, low-pressure chemical vapor deposition (LPCVD) and plasma-enhanced CVD (PECVD). In some embodiments, the gate dielectric layer uses a high-k dielectric material including, for example, hafnium oxide ($HfO_2$), $Al_2O_3$, lanthanide oxides, $TiO_2$, HfZrO, $Ta_2O_3$, $HfSiO_4$, $ZrO_2$, $ZrSiO_2$, combinations thereof, or other suitable material, and the gate dielectric layer is formed by ALD and/or other suitable methods. The metal gate layer includes a p-type work function metal or an n-type work function metal, and is deposited by CVD, PVD, and/or other suitable process. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The one or more metal layers use aluminum (Al), tungsten (W), copper (Cu), cobalt (Co), and/or other suitable materials; and are formed by CVD, PVD, plating, and/or other suitable processes. The formations and/or materials associated with the gates 601-608 are given for illustrative purposes. Various formations and/or materials associated with the gates 601-608 are within the contemplated scope of the present disclosure.

The via VM1 couples the power rail 202 to the conductive line 303. The via VM2 couples the power rail 201 to the conductive line 301. The vias VD1-VD2 couple the conductive line 303 to the active area 401. The vias VD3-VD4 couples the active area 401 to the conductive line 301. The via VD5 couples the active area 403 to the conductive line 302, and the via VD6 couples the active area 404 to the conductive line 302.

Figure 3C:
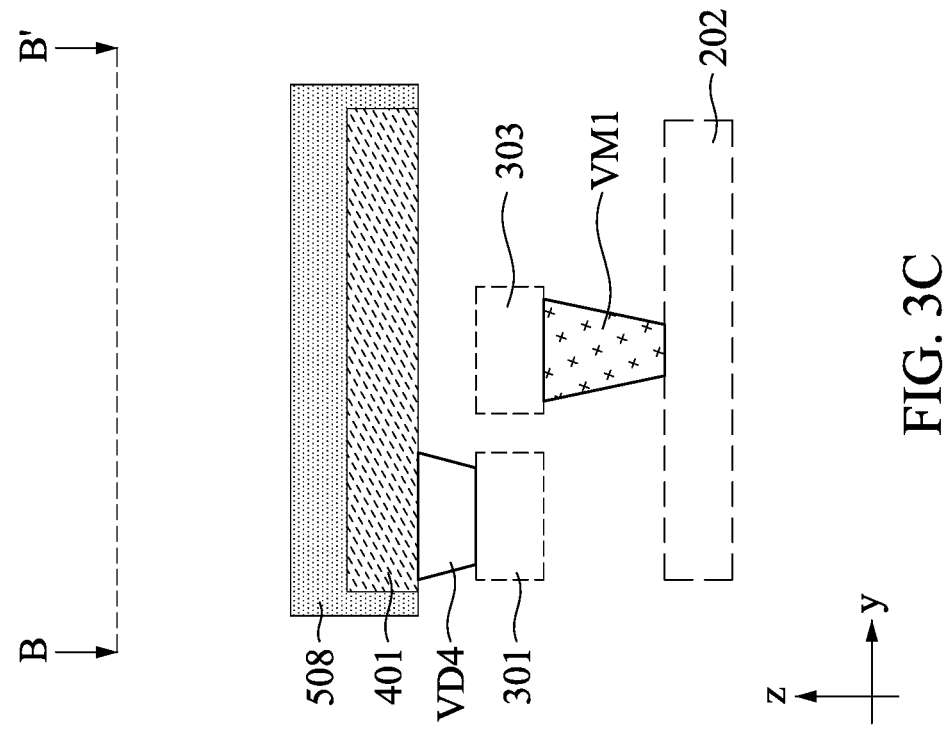
FIGS. 3B-3C are cross-sectional views of part of the integrated circuit in FIG. 3A, in accordance with various embodiments.
Figure 3B:
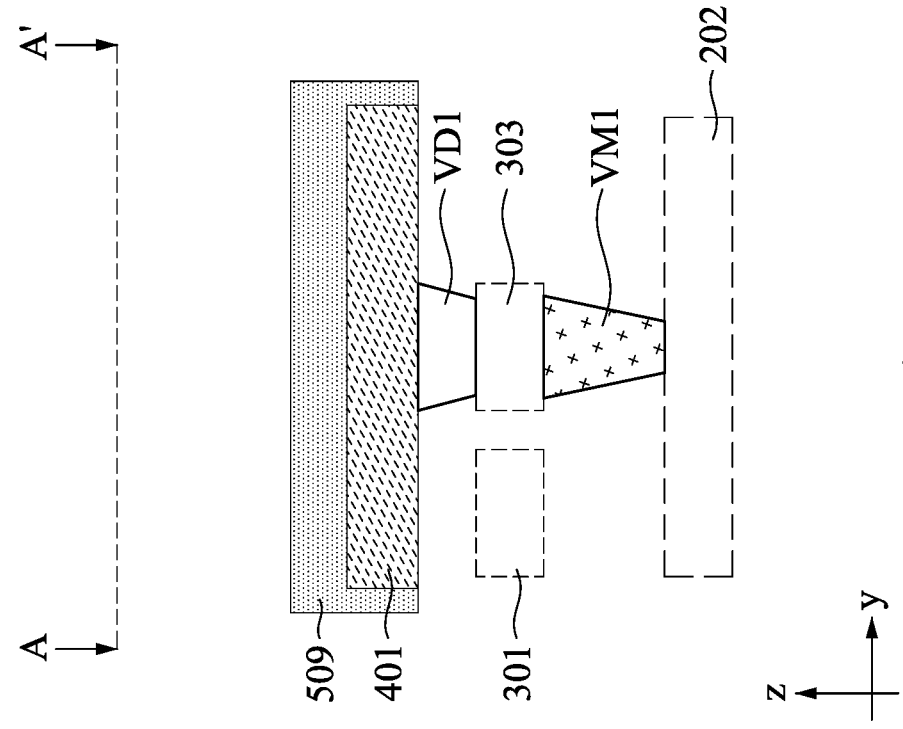

Reference is now made to FIGS. 3B-3C. FIG. 3B is a cross-sectional view of part of the integrated circuit 10 in FIG. 3A along line AA', and FIG. 3C is a cross-sectional view of part of the integrated circuit 10 in FIG. 3A along line BB', and in accordance with various embodiments.

As shown in FIG. 3B, the power rail 202 is coupled to the active area 401 through the via VM1, the conductive line 303, the via VD1. The conductive segment 509 is coupled to and covers the active area 401.

As shown in FIG. 3C, the power rail 202 is coupled to the conductive line 303. The conductive segment 508 is coupled to and covers the active area 401. The active area 401 is coupled to the conductive line 301 through the via VD4.

The configurations of FIGS. 3A-3C are given for illustrative purposes. Various implements are within the contemplated scope of the present disclosure. For example, in some embodiments, the power gate circuit 100 does not include the conductive segments 509-510, the gates 606-608, and the vias VD1 and VD3. In some alternative embodiments, the integrated circuit 10 further includes another conductive line configured with respect to the conductive line 301 and disposed next to the conductive lines 302-303, and the integrated circuit 10 also includes a via coupled between another conductive line and the conductive segment 508.

Figure 4A:
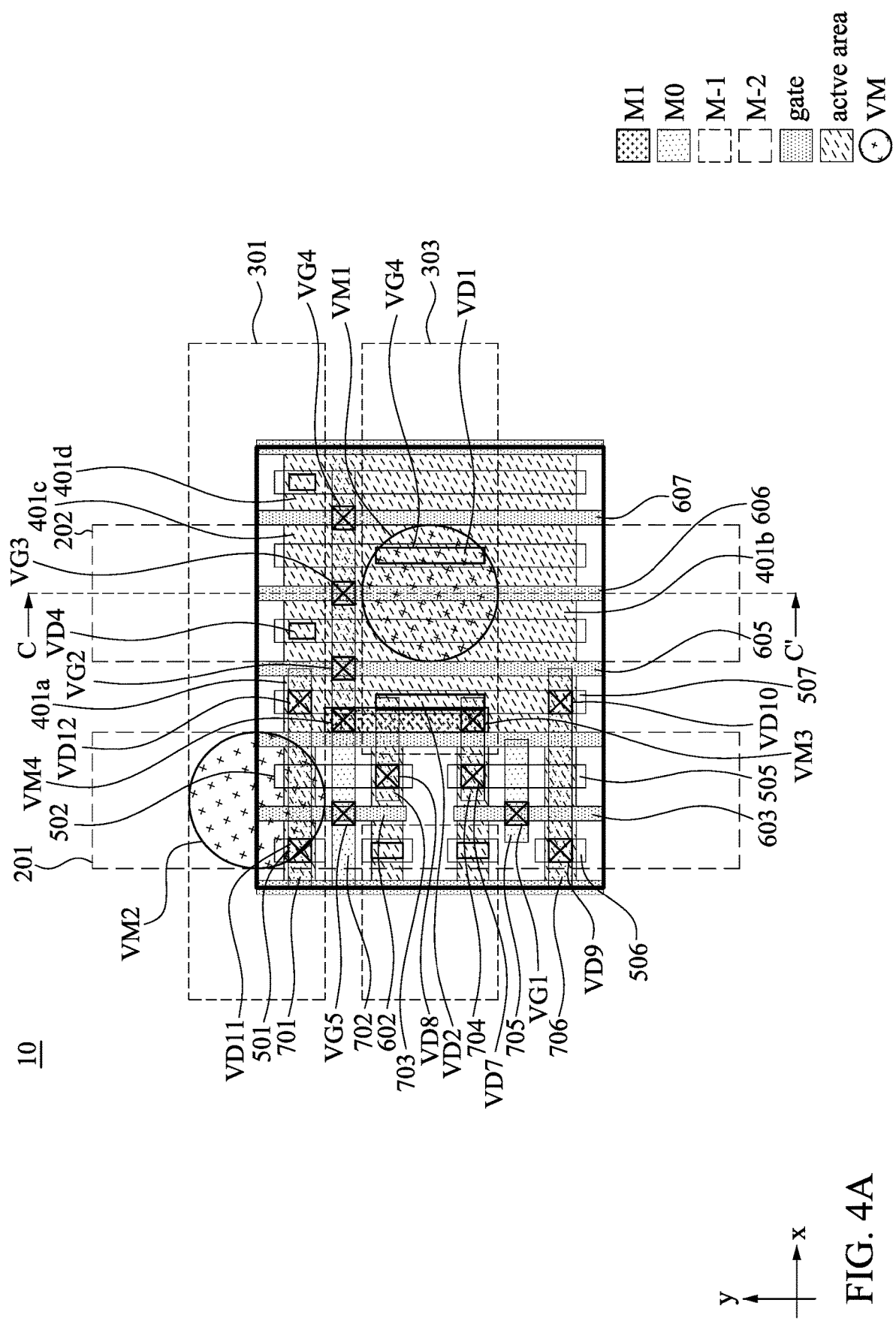
FIG. 4A is a layout diagram in a plan view corresponding to part of the integrated circuit of FIG. 3A, in accordance with various embodiments.

Reference is now made to FIG. 4A. FIG. 4A is a layout diagram in a plan view corresponding to part of the integrated circuit 10 of FIG. 3A, in accordance with various embodiments. With respect to the embodiments of FIGS. 1A-3C, like elements in FIG. 4A are designated with the same reference numbers for ease of understanding.

As shown in FIG. 4A, the integrated circuit 10 further includes conductive traces 701-706, conductive pattern 801, and vias VD7-VD12, VG1-VG5, and VM3-VM4. In some embodiments, the conductive traces 701-706 are disposed in a fourth layer above the third layer. The conductive pattern 801 is disposed in a fifth layer above the fourth layer. The vias VD7-VD12 and VG1-VG5 are disposed between the third layer and fourth layer. The vias VM3-VM4 are disposed between the fourth layer and the fifth layer.

For illustration, the conductive traces 701-706 extend in the x-direction and are separated from each other. In some embodiments, the conductive traces 701-706 are referred to as metal-zero (M0) layers. Specifically, the conductive trace 701 crosses the conductive segments 501-502, 507 and the gate 602. The conductive trace 702 crosses the conductive segments 502, 507-510 and the gates 604-607. The conductive trace 703 crosses the conductive segments 502, 507 and the gate 604. The conductive trace 704 crosses the conductive segments 505, 507 and the gate 604. The conductive trace 705 crosses the conductive segment 505 and the gate 603. The conductive trace 706 crosses the conductive segments 505-507 and the gates 603-604.

The conductive pattern 801 extends in the y-direction and crosses the conductive traces 702-704.

The via VG1 couples the conductive trace 705 to the gate 603. The via VD7 couples the conductive segment 505 to the conductive trace 704. The via VM3 couples the conductive trace 704 to the conductive pattern 801. The via VM4 couples the conductive pattern 801 to the conductive trace 702. The vias VG2-VG5 couple the conductive trace 702 to the gates 605-607, and 602 separately.

Based on the aforementioned configurations, in some embodiments, the signal NSLEEPIN of FIG. 1A is transmitted into the gate 603 through the trace 705 and the via VG1, and the input signal IN of FIG. 1A is output through the conductive segment 505, the via VD7, the conductive trace 704, the via VM3, the conductive pattern 801, the via VM4, the conductive trace 702, and the vias VG2-VG4 to the gates 605-607. Accordingly, when the transistor M1 is turned on in response to the input signal IN, a conductive channel between the active regions 401a-401b, another conductive channel between the active regions 401b-401c, and the other conductive channel between the active regions 401c-401d are created. For instance, a portion of a current, input from the power rail 202, flows to the power rail 201 through a path including the via VM1, the conductive line 303, the via VD2, the active region 401a, the conductive channel between the active regions 401a-401b, the active region 401b, the via VD4, the conductive line 301, and the via VM2. Similarly, another portion of the current flows to the power rail 201 through another path including the via VM1, the conductive line 303, the via VD1, the active region 401c, another channel between the active regions 401b-401c, the active region 401b, the via VD4, the conductive line 301, and the via VM2. The other portion of the current flows to the power rail 201 through the via VM1, the conductive line 303, the via VD1, the active region 401c, the conductive channel between the active regions 401c-401d, the active region 401d, the via VD3, the conductive line 301, and the via VM2. Alternatively stated, by the configurations of FIG. 4A, the power rail 201 further outputs the supply voltage VDD corresponding to the external voltage TVDD input from the power rail 202.

With continued reference to FIG. 4A, the vias VD7 and VD8 couple the conductive segments 501 and 507 to the conductive trace 701 respectively. The vias VD11 and VD12 couple the conductive segments 506 and 507 to the conductive trace 706 respectively. Accordingly, in some embodiments, the conductive segment 501 corresponding to the second terminal of the transistor M4 and the conductive segment 506 corresponding to the second terminal of the transistor M4 are coupled to the external voltage TVDD.

The via VD8 couples the conductive segment 502 to the conductive trace 703. In some embodiments, the signal NSLEEPOUT of FIG. 1A is output from the conductive segment 502 corresponding to the first terminals of the transistors M4-M5.

In some embodiments, the conductive line 302 receives a voltage, i.e., VSS for the integrated circuit 10. For illustration, as shown in FIG. 4A, the conductive segments 503-504, corresponding to the second terminals of the transistors M3 and M5, are coupled to the conductive line 302 through the vias VD5-VD6 to receive the voltage VSS.

Figure 4B:
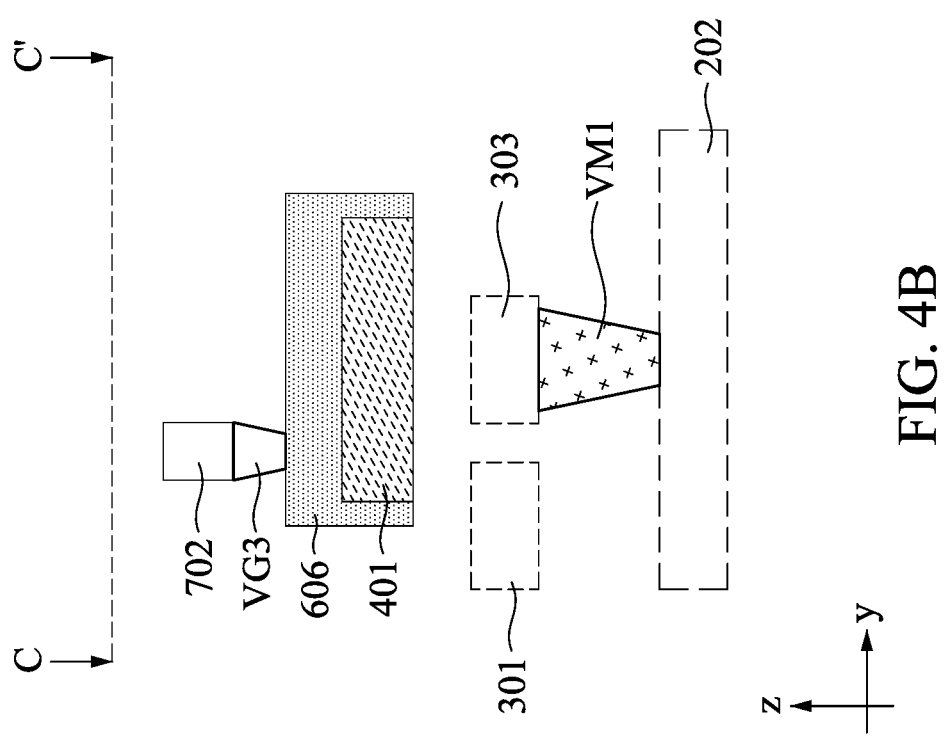
FIG. 4B is a cross-sectional view of part of the integrated circuit in FIG. 4A, in accordance with various embodiments.

Reference is now made to FIG. 4B. FIG. 4B is a cross-sectional view of part of the integrated circuit 10 in FIG. 4A along line CC', in accordance with various embodiments. For illustration, the conductive trace 702 is coupled to the gate 606 through the via VG3. The gate 606 covers the active area 401.

In some approaches, power rails corresponding to the power rails 201-202 are disposed in a layer above a circuit, for example, the power gate circuit 100 and/or the cell circuit for computing. Alternatively stated, those power rails of a front-side power distribution network occupy the front-side routing resources in those approaches, and induce adverse effect in scaling down sizes of integrated circuits.

With the configurations of the present disclosure, the power rails 201-202 are disposed under the power gate circuit 100 (and/or the circuit for computing) to input an external voltage and to output the supply voltage. Accordingly, in the power distribution network as implemented by the power rails 201-202, the front-side routing resources are maximized, and even the power IR drop impact induced by the power rails is minimized.

The configurations of FIGS. 4A-4B are given for illustrative purposes. Various implements are within the contemplated scope of the present disclosure. For example, in some embodiments, another power rail configured with respect to the power rail 201 is disposed next to the power rail 202 and is coupled to the conductive line 301. Another power rail outputs the voltage VDD along with the power rail 201.

Figure 5A:
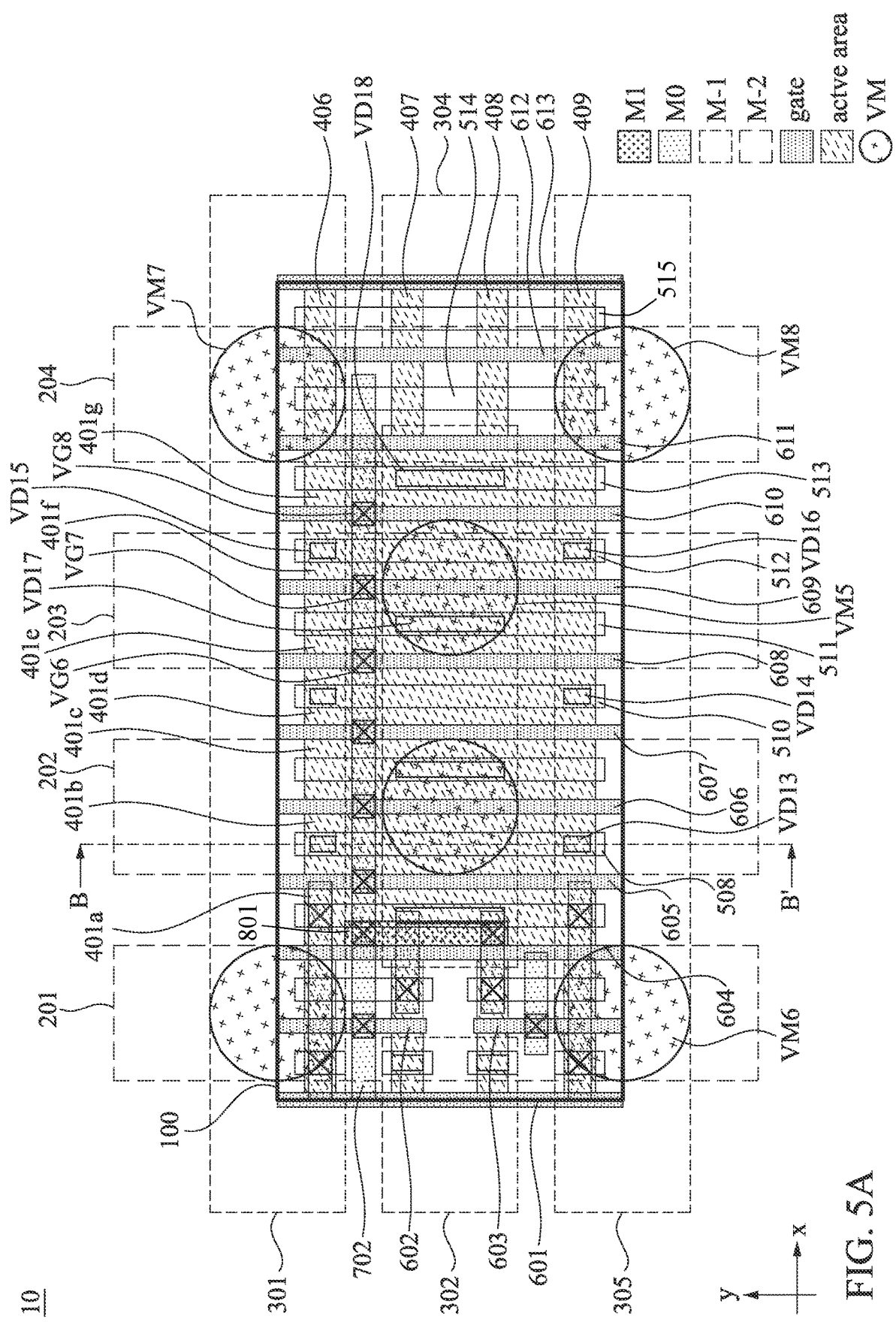
FIG. 5A is a layout diagram in a plan view corresponding to part of the integrated circuit of FIG. 1B, in accordance with various embodiments.

Reference is now made to FIG. 5A. FIG. 5A is a layout diagram in a plan view corresponding to part of the integrated circuit 10 of FIG. 1B, in accordance with various embodiments. With respect to the embodiments of FIGS. 1A-4B, like elements in FIG. 5A are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 5A.

Compared with FIG. 4A, the integrated circuit 10 further includes power rails 203-204, conductive lines 304-305, active areas 406-409, conductive segments 511-515, gates 609-613, and vias VD13-VD18, VG6-VG8, and VM5-VM8. In some embodiments, the power rails 203-204 are configured with respect to, for example, the power rails 202 and 201 respectively. The power rails 201 and 204 are referred to as a pair of power rails, and the power rails 202-204 are referred to as another pair of power rails. The conductive lines 304-305 are configured with respect to, for example, the conductive lines 302 and 305 respectively. The active areas 406-409 are configured with respect to, for example, the active areas 402-405 separately. The conductive segments 511-515 are configured with respect to, for example, the conductive segment 510. The gates 609-613 are configured with respect to, for example, the gate 608. The vias VD13-VD16 are configured with respect to, for example, the via VD3. The vias VD17-VD18 are configured with respect to, for example, the via VD2. The vias VG6-VG8 are configured with respect to, for example, the via VG4. The via VM5-VM8 are configured with respect to, for example, the via VM1.

In some embodiments, the conductive segments 511 and 513 together correspond to the source of the transistor M1, and the conductive segments 510 and 512 together correspond to a drain of the transistor M1. The gates 608-610 together correspond to the gate of the transistor M1. In some embodiments, the gates 611-613 are referred to as dummy gates.

For illustration, the power rails 203-204 extend in the y-direction and are separated from each other in the x-direction. In some embodiments, the power rails 202-203 output the external voltage TVDD to the power gate circuit 100, and the power rails 201 and 204 outputs the supply voltage VDD from the power gate circuit 100. In some embodiments, the power rails 203-204 are referred to as metal-minus-two (M-2) layers.

The conductive lines 302-304 are disposed in the same row. The conductive line 303 further crosses the power rail 203 and the conductive line 304 crosses the power rail 204. The conductive line 305 is disposed next to the conductive lines 302-304 and extend in the x-direction. The conductive line 305 crosses the power rails 201-204 in the layout view. In some embodiments, the conductive lines 304-305 are referred to as metal-minus-one (M-1) layers.

Compared with FIG. 3A, the active area 401 further includes active regions 401e-401g as shown in FIG. 5A.

For illustration, the active areas 406-409 extend in the x-direction. The active areas 406-409 are separated from each other in the y-direction. The active area 406 overlaps the conductive line 301. The active areas 407-408 overlap the conductive lines 303-304. The active area 409 overlaps the conductive line 305.

In some embodiments, the active areas 406 and 409 are doped with P-type dopant, such as boron, indium, aluminum, gallium, or a combination thereof. The active areas 407-408 are doped with N-type dopants, such as phosphorus, arsenic, or a combination thereof.

The gates 609-613 extend in the y-direction and are separated from each other in the x-direction. As shown in FIG. 5A, the gates 608-610 cross the active area 401. The gate 611 is disposed between the active area 401 and active areas 406-409. The gate 612 crosses the active areas 406-409.

The via VM5 couples the power rail 203 to the conductive line 303. The via VM6 couples the power rail 201 to the conductive line 305. The vias VM7-VM8 couple the power rail 204 to the conductive lines 301 and 305 respectively. The vias VD13, VD14, and VD16 couples the active area 401 to the conductive line 305. The via VD 15 couples the active area 401 to the conductive line 301. The vias VD17-VD18 couple the conductive line 303 to the active area 401.

Compared with FIG. 4A, the conductive trace 702 further couples to the gates 608-610 through the vias VG6-VG8.

Figure 5B:
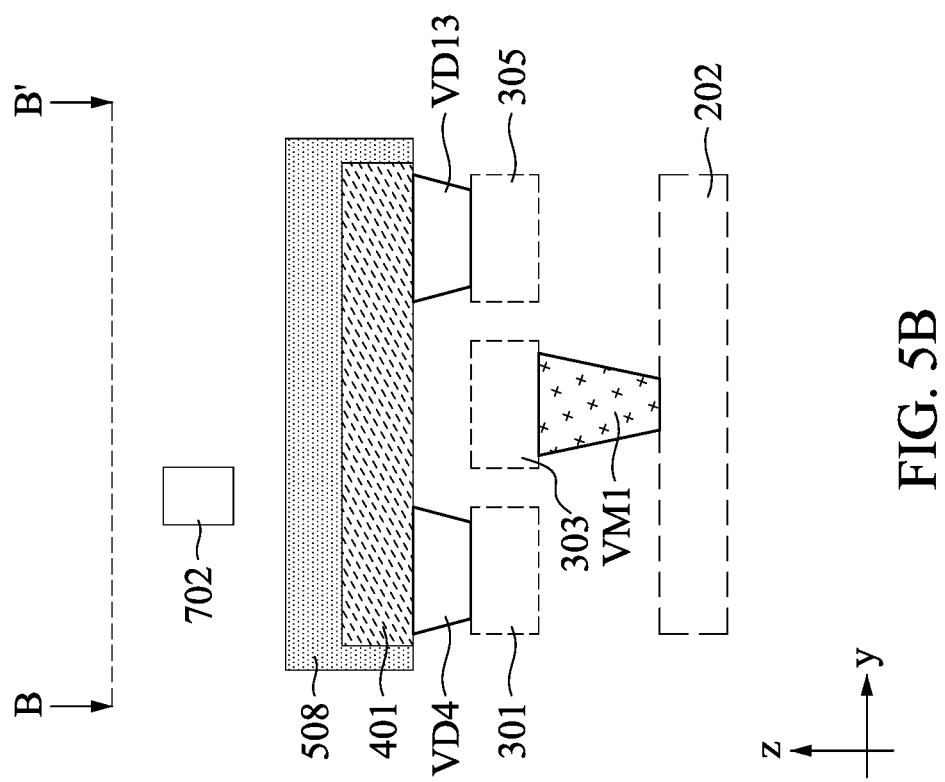
FIG. 5B is a cross-sectional view of part of the integrated circuit in FIG. 4A, in accordance with various embodiments.

Reference is now made to FIG. 5B. FIG. 5B is a cross-sectional view of part of the integrated circuit 10 in FIG. 5A along line BB', in accordance with various embodiments. Compared with FIG. 3C, the via VD13 is disposed and coupled between the active area 401 and the conductive line 405.

Figure 6:
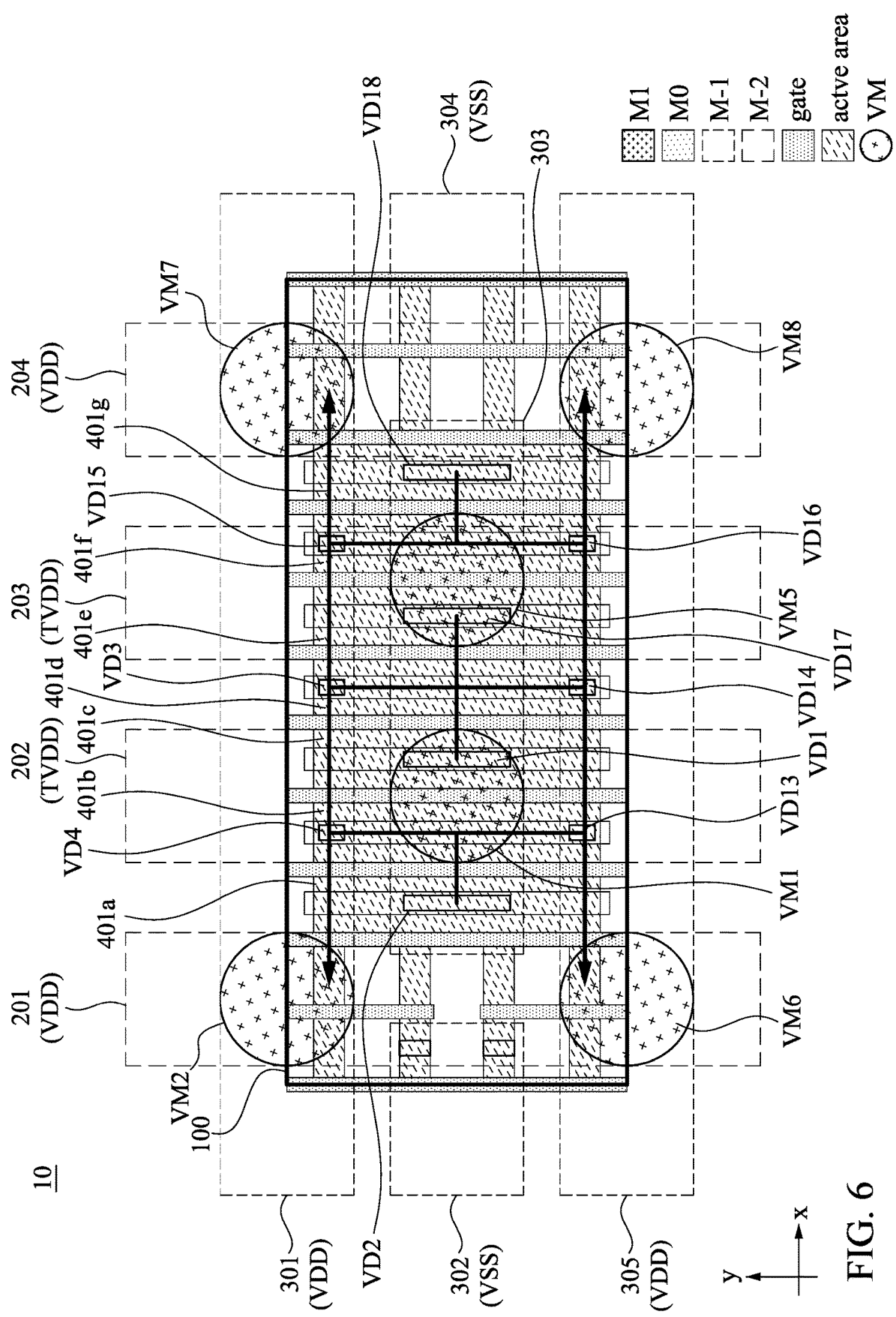
FIG. 6 is a schematic operation diagram corresponding to part of the integrated circuit of FIG. 5A, in accordance with various embodiments.

Reference is now made to FIG. 6. FIG. 6 is a schematic operation diagram corresponding to part of the integrated circuit 10 of FIG. 5A, in accordance with various embodiments. With respect to the embodiments of FIGS. 1A-5B, like elements in FIG. 6 are designated with the same reference numbers for ease of understanding. For the sake of simplicity, the metal layers corresponding to metal-zero layers and metal-one layers, and some vias are not shown in FIG. 6.

In some embodiments, when the transistor M1 is turned on in response to the input signal IN, a conductive channel between the active regions 401a-401b, another conductive channel between the active regions 401c-401d, still another conductive channel between the active regions 401d-401e, and the other conductive channel between the active regions 401f-401g are created.

For illustration, the arrows in FIG. 6 indicate currents flowing through elements in power gate circuit 100. In some embodiments, a portion of a current, input from the power rail 202, flows to the power rail 201 through a path including the via VM1, the conductive line 303, the via VD2, the active region 401a, the conductive channel between the active regions 401a-401b, the active region 401b, the vias VD4 and VD13, the conductive lines 301 and 305, and the vias VM2 and VM6, and also flows to the power rail 204 through the conductive lines 301 and 305 and the vias VM7-VM8.

Similarly, the other portion of the current, input from the power rail 202, flows to the power rail 201 through the other path including the via VM1, the conductive line 303, the via VD1, the active region 401c, another channel between the active regions 401c-401d, the active region 401d, the vias VD3 and VD14, the conductive lines 301 and 305, the vias VM2 and VM6, and also flows to the power rail 204 through the conductive lines 301 and 305 and the vias VM7-VM8.

A portion of a current, input from the power rail 203, flows to the power rail 201 through the via VM5, the conductive line 303, the via VD17, the active region 401e, the conductive channel between the active regions 401d-401e, the active region 401d, the vias VD3 and VD14, the conductive lines 301 and 305, the vias VM2 and VM6, and also flows to the power rail 204 through the conductive lines 301 and 305 and the vias VM7-VM8.

The other portion of the current, input from the power rail 203, flows to the power rail 201 through the via VM5, the conductive line 303, the via VD18, the active region 401g, the conductive channel between the active regions 401f-401g, the active region 401f, the vias VD15-VD16, the conductive lines 301 and 305, the vias VM2 and VM6, and also flows to the power rail 204 through the conductive lines 301 and 305 and the vias VM7-VM8.

Based on the aforementioned configurations of FIG. 6, the pair of power rails 201 and 204 outputs the supply voltage VDD corresponding to the external voltage TVDD input from the pair of power rails 202-203.

The configurations of FIG. 6 are given for illustrative purposes. Various implements are within the contemplated scope of the present disclosure. For example, in some embodiments, a conductive channel between the active regions 401b-401c is created to transmit the current input from the power rail 202. Another conductive channel between the active regions 401e-401f is created to transmit the current input from the power rail 203. In alternative embodiments, the active areas 406-409 are not included in the power gate circuit 100.

Figure 7:
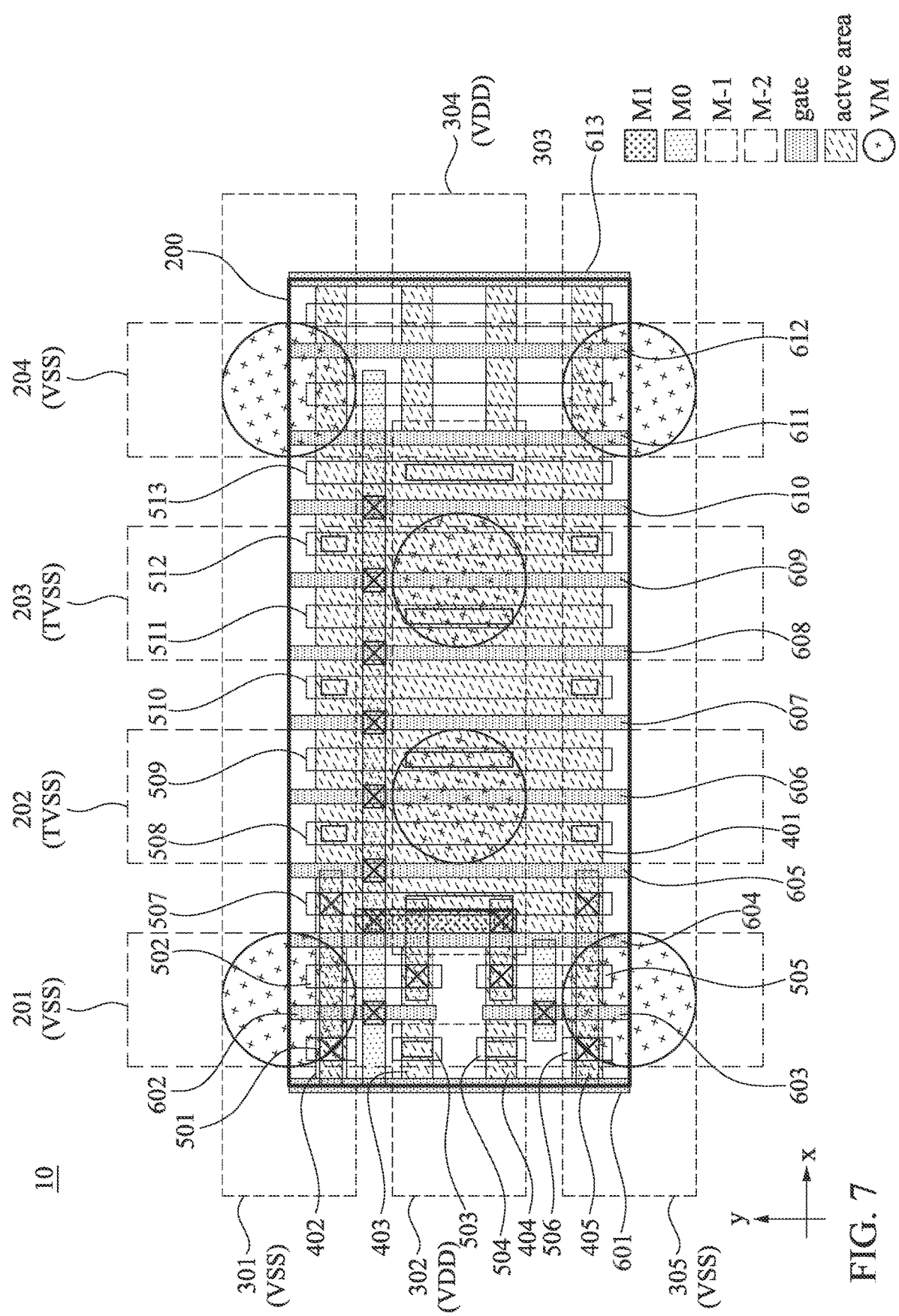
FIG. 7 is a layout diagram in a plan view corresponding to part of the integrated circuit of FIG. 2B, in accordance with various embodiments.

Reference is now made to FIG. 7. FIG. 7 is a layout diagram in a plan view corresponding to part of the integrated circuit 10 of FIG. 2B, in accordance with various embodiments. With respect to the embodiments of FIGS. 1A-6, like elements in FIG. 7 are designated with the same reference numbers for ease of understanding.

Compared with FIG. 5A, instead of the active areas 401, 402, 405-406, and 409 being P-type doped areas and the active areas 403-404, and 407-408 being N-type doped areas, the active areas 401, 402, 405-406, and 409 of the power gate circuit 200 in the integrated circuit 10 are N-type doped areas, and the active areas 403-404, and 407-408 are P-type doped areas.

In some embodiments, with reference to FIGS. 2B and 7 together, the active area 401 is configured in the formation of the transistor M6, and the active areas 402-405 are configured in the formation of the transistors M5, M4, M2, and M3 separately. The conductive segment 501 corresponds to the second terminal of the transistor M5, and the conductive segment 502 corresponds to the first terminals of the transistors M4-M5. The gate 602 corresponds to the gates of the transistors M4-M5. The conductive segment 503 corresponds to the second terminal of the transistor M4. The conductive segment 504 corresponds to the second terminal of the transistor M2, and the conductive segment 505 corresponds to the first terminals of the transistors M2-M3. The gate 603 corresponds to the gates of the transistors M2-M3. The conductive segment 506 corresponds to the second terminal of the transistor M3. The conductive segments 507, 509, 511, and 513 together correspond to the drain of the transistor M6, and the conductive segments 508, 510, and 512 together correspond to a source of the transistor M6. The gates 605-610 together correspond to the gate of the transistor M6. With the conductive segments 507, 509, 511, and 513 coupled to the drain of the transistor M6, the conductive segments 508, 510, and 512 coupled to the source of the transistor M6, and the gates 605-610 coupled together to form the gate of the transistor M6, transistor M6 can be formed in a parallel configuration based on these elements, according to some embodiments. In some embodiments, the gates 601, 604, and 613 are referred to as dummy gates.

The configurations of the power gate circuit 200 are similar to the power gate circuit 100 of FIG. 5A. Furthermore, instead of inputting the external voltage TVDD as shown in FIG. 5A, the pair of power rails 202-203 inputs the external voltage TVSS to the power gate circuit 200. Accordingly, when the transistor M6 is turned on in response to the input signal IN, the power gate circuit 200 receives the external voltage TVSS through the pair of power rails 202-203 and outputs the supply voltage VSS through the pair of power rails 201 and 204.

In some embodiments, instead of the conductive lines 302 and 304 receiving the voltage VSS for the integrated circuit 10, the conductive lines 302 and 304 receive a voltage, i.e., VDD, accordingly, the conductive segments 503-504, corresponding to the second terminals of the transistors M2 and M4, are coupled to the conductive line 302 through the vias VD5-VD6 to receive the voltage VDD.

Figure 8:
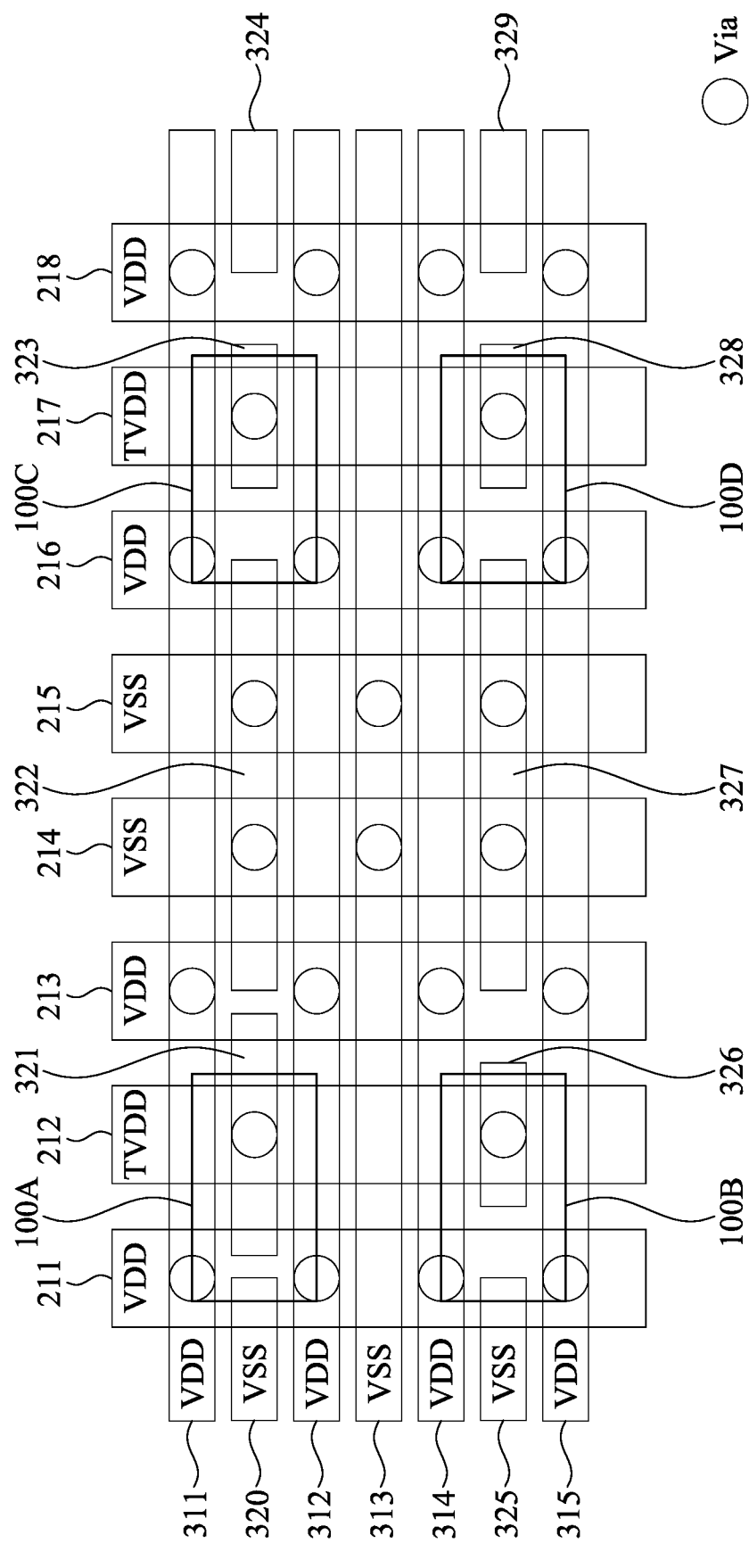
FIG. 8 is a layout diagram in a plan view of part of an integrated circuit, in accordance with various embodiments.

Reference is now made to FIG. 8. FIG. 8 is a layout diagram in a plan view of part of an integrated circuit 80, in accordance with various embodiments. With respect to the embodiments of FIGS. 1A-7, like elements in FIG. 8 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 8.

As illustratively shown in FIG. 8, the integrated circuit 80 includes power rails 211-218, conductive lines 311-315, and 320-329, and power gate circuits 100A-100D. The power rails 211-218 are disposed in a first layer, and configured with respect to, for example, the power rails 201-202 of FIG. 4A. The conductive lines 311-315 are disposed in a second layer above the first layer, and configured with respect to, for example, the conductive line 301 of FIG. 4A. The conductive lines 320-329 are disposed in the second layer, and configured with respect to, for example, the conductive lines 302-303 of FIG. 4A. The power gate circuit 100A-100D are disposed in a third layer above the second layer, and configured with respect to, for example, the power gate circuit 100 of FIG. 4A. The vias are disposed between the first and second layer, and configured with respect to, for example, the via VM1 of FIG. 4A. For the sake of simplicity, metal layers corresponding to metal-zero and metal-one layer and the corresponding vias are not shown in FIG. 8.

For illustration, the power rails 211-218 extend in the y-direction and are separated from each other in the x-direction. In some embodiments, the power rails 212 and 217 receive the external voltage TVDD. The power rails 214-215 receive the voltage VSS. The power rails 211, 213, 216, and 218 are configured to output the supply voltage VDD corresponding to the external voltage TVDD.

The conductive lines 311-315 and 320-329 extend in the x-direction. As shown in FIG. 8, the conductive lines 320-324 are disposed in the same row and interposed between the conductive lines 311-312. The conductive lines 325-329 are disposed in the same row and interposed between the conductive lines 314-315. The conductive lines 311-315 cross the power rails 211-218. The conductive line 320 and 325 overlap the power rail 211. The conductive line 321 overlaps the power rails 211-213. The conductive lines 322 and 327 overlap the power rails 213-216. The conductive lines 323 and 328 overlap the power rail 217. The conductive lines 324 and 329 overlap the power rail 218.

The conductive lines 311-312, and 314-315 couple to the power rails 211, 213, 216, and 218 through vias. The conductive lines 313, 322, and 327 couple to the power rails 214-215 through vias. The conductive lines 321 and 326 couple to the power rail 212 through vias, and the conductive lines 323 and 328 couple to the power rail 217 through vias. In some embodiments, the conductive lines 320, 324, 325, and 329 are coupled to the voltage VSS.

The power gate circuit 100A is coupled to the power rail 212 through the conductive line 321 and vias, and coupled to the power rail 211 through the conductive lines 311-312 and vias. In some embodiments, the power gate circuit 100A is coupled to the conductive line 320. Similarly, the power gate circuit 100B is coupled to the power rail 212 through the conductive line 326 and vias, and coupled to the power rail 211 through the conductive lines 314-315 and vias. In some embodiments, the power gate circuit 100B is coupled to the conductive line 325. The power gate circuit 100C is coupled to the power rail 217 through the conductive line 323 and vias, and coupled to the power rail 216 through the conductive lines 311-312 and vias. In some embodiments, the power gate circuit 100C is coupled to the conductive line 322. The power gate circuit 100D is coupled to the power rail 217 through the conductive line 328 and vias, and coupled to the power rail 216 through the conductive lines 314-315 and vias. In some embodiments, the power gate circuit 100D is coupled to the conductive line 327.

In some embodiments, the conductive line coupling a power gate circuit to a power rail having an external voltage, i.e., the conductive lines 321, 323, 326, and 328, is shorter than the conductive line coupling the power gate circuit to a power rail outputting a supply voltage, i.e., the conductive lines 311-312, and 314-315.

The configurations of FIG. 8 are given for illustrative purposes. Various implements are within the contemplated scope of the present disclosure. For example, in some embodiments, a number of the power rail, i.e., the power rail 212, receiving the external voltage TVDD is more than one, and the length of the conductive line coupled between the power gate circuit and the power rail receiving the external voltage is associated with the number of the power rail. In alternative embodiments, the power gate circuit 100A overlaps the power rail 213. In alternative embodiments, the power gate circuit 100C, instead of overlapping the power rail 216, overlaps the power rail 218. In alternative embodiments, the power gate circuit 100D is not coupled to the conductive line 315.

Figure 9:
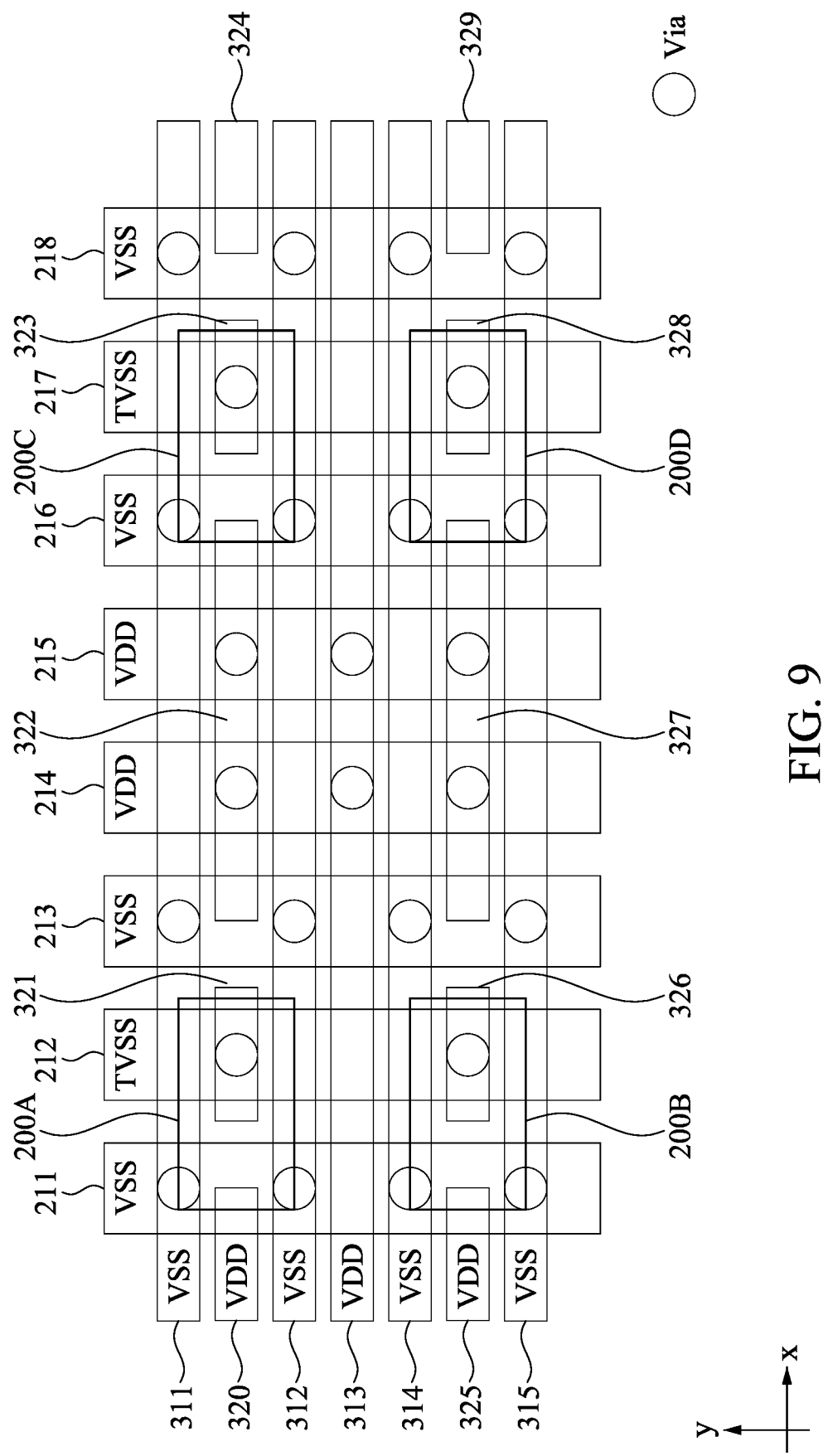
FIG. 9 is a layout diagram in a plan view of part of an integrated circuit, in accordance with various embodiments.

Reference is now made to FIG. 9. FIG. 9 is a layout diagram in a plan view of part of the integrated circuit 80, in accordance with various embodiments. With respect to the embodiments of FIGS. 1A-8, like elements in FIG. 9 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 9.

Compared with FIG. 8, instead of the power gate circuits 100A-100D, the integrated circuit 80 includes power gate circuits 200A-200D in the third layer. In some embodiments, the power gate circuits 200A-200D are configured with respect to, for example, the power gate circuit 200 of FIG. 6.

Instead of receiving the external voltage TVDD, the power rails 212 and 217 receive the external voltage TVSS. The power rails 214-215 receive the voltage VDD. The power rails 211, 213, 216, and 218 are configured to output the supply voltage VSS corresponding to the external voltage TVSS.

In some embodiments, instead of receiving the voltage VSS, the conductive lines 320, 324, 325, and 329 are coupled to the voltage VDD.

The configurations of the power gate circuits 200A-200D are similar to that of the power gate circuits 100A-100D of FIG. 8. Thus, the repetitious descriptions are omitted here.

The configurations of FIG. 9 are given for illustrative purposes. Various implements are within the contemplated scope of the present disclosure. For example, the integrated circuit 80 includes less than four power gate circuits.

Figure 10:
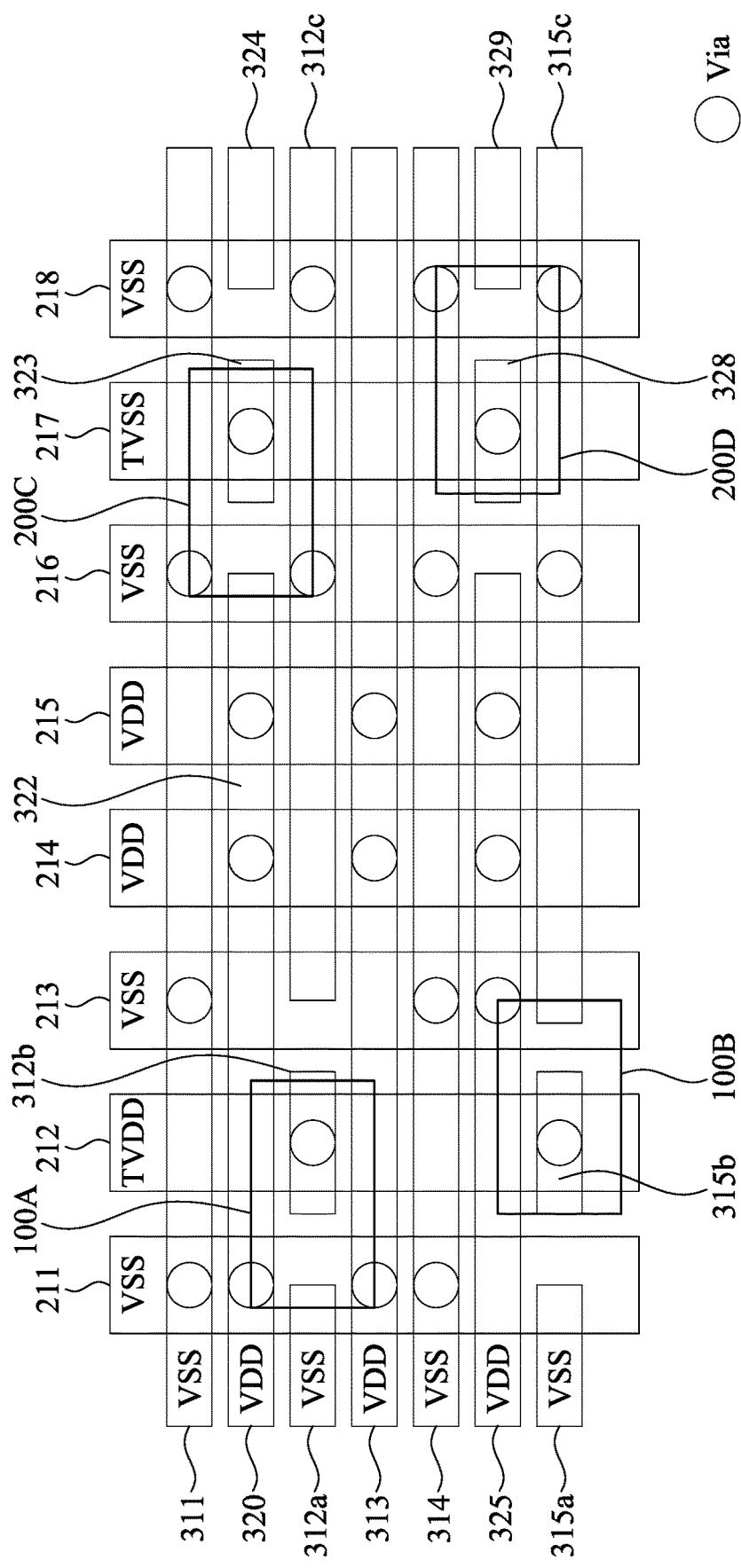
FIG. 10 is a layout diagram in a plan view of part of an integrated circuit, in accordance with various embodiments.

Reference is now made to FIG. 10. FIG. 10 is a layout diagram in a plan view of part of the integrated circuit 80, in accordance with various embodiments. With respect to the embodiments of FIGS. 1A-9, like elements in FIG. 10 are designated with the same reference numbers for ease of understanding. The specific operations of similar elements, which are already discussed in detail in above paragraphs, are omitted herein for the sake of brevity, unless there is a need to introduce the co-operation relationship with the elements shown in FIG. 10.

Compared with FIG. 9, instead of the power rail 212 receiving the external voltage TVSS, the power rail 212 of FIG. 10 receives the external voltage TVDD.

Furthermore, instead of having the conductive lines 312 and 315, the integrated circuit 80 further includes conductive lines 312a-312c and 315a-315c. As shown in FIG. 10, the conductive line 320 further crosses the power rails 211-216. The conductive line 312a overlaps the power rail 211, the conductive line 312b crosses the power rail 212, and the conductive line 312c overlaps the conductive lines 213-218. The conductive line 325 crosses the power rails 211-216. The conductive line 315a overlaps the power rail 211, the conductive line 315b crosses the power rail 212, and the conductive line 315c overlaps the power rails 213-218.

For illustration, the conductive line 320 is coupled to the power rails 214-215 through vias. The conductive line 312b is coupled to the power rail 212 through via. The conductive line 312c is coupled to the power rails 216 and 218 through vias. The conductive line 325 is coupled to the power rails 214-215 through vias. The conductive line 315b is coupled to the power rail 212 through via. The conductive line 315c is coupled to the power rails 216 and 218 through vias. In some embodiments, the conductive lines 324 and 329 are coupled to the voltage VDD, and the conductive lines 312a and 315a are coupled to the voltage VSS.

In addition, compared with FIG. 9, instead of having the power gate circuits 200A-200B, the integrated circuit 80 further includes the power gate circuits 100A-100B of FIG. 8.

The power gate circuit 100A is coupled to the power rail 212 through the conductive line 312b and vias, and coupled to the power rails 214-215 through the conductive lines 320 and 313 and vias. In some embodiments, the power gate circuit 100A is coupled to the conductive line 312a, or the power gate circuit 100A overlaps and is coupled to the conductive line 312c to receive the voltage VSS from the power gate circuit 200C. Accordingly, the power gate circuit 100A is configured to output the supply voltage VDD to the power rails 214-215. Similarly, the power gate circuit 100B is coupled to the power rail 212 through the conductive line 315b and vias, and coupled to the power rails 214-215 through the conductive line 325 and vias. In some embodiments, the power gate circuit 100B is coupled to the conductive line 315c to receive the voltage VSS from the power gate circuit 200D. Accordingly, the power gate circuit 100B is configured to output the supply voltage VDD to the power rails 214-215.

The power gate circuit 200C is coupled to the power rail 217 through the conductive line 323 and vias, and coupled to the power rails 216 and 218 through the conductive lines 311, 312c and vias. In some embodiments, the power gate circuit 200C is coupled to the conductive line 320 to receive the voltage VDD. Accordingly, the power gate circuit 200C is configured to output the supply voltage VSS to the power rails 216 and 218. Similarly, the power gate circuit 200D is coupled to the power rail 217 through the conductive line 328 and vias, and coupled to the power rail 218 through the conductive lines 314, 315c and vias. In some embodiments, the power gate circuit 200D overlaps and is coupled to the conductive line 325 to receive the voltage VDD. Accordingly, the power gate circuit 200D is configured to output the supply voltage VSS to the power rail 218.

The configurations of FIG. 10 are given for illustrative purposes. Various implements are within the contemplated scope of the present disclosure. For example, in some embodiments, the power gate circuit 200D overlaps and is coupled to the power rail 216. In various embodiments, the power gate circuit 200C overlaps the conductive line 324 to receive the voltage VDD.

Figure 11:
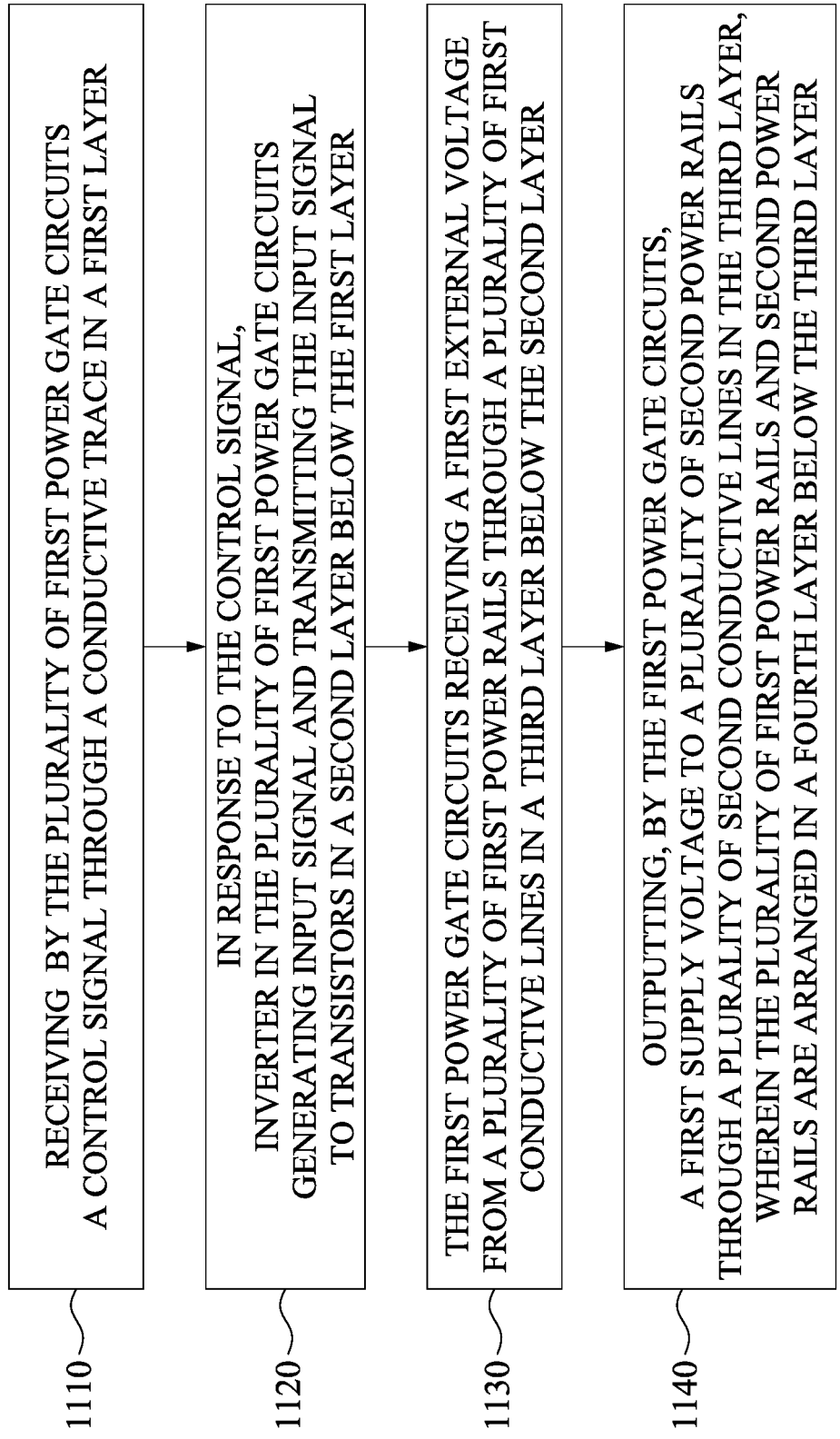
FIG. 11 is a flow chart of a method of operating an integrated circuit, in accordance with various embodiments.

Reference is now made to FIG. 11. FIG. 11 is a flow chart of a method 1100 of operating the integrated circuit 10 or 80, in accordance with various embodiments. It is understood that additional operations can be provided before, during, and after the processes shown by FIG. 11, and some of the operations described below can be replaced or eliminated, for additional embodiments of the method 1100. The method 1100 includes operations 1110-1140 that are described below with reference to FIGS. 4A, and 8.

In operation 1110, the signal NSLEEPIN is received by the conductive trace 801 in a first layer of each of the power gate circuits 100A-100D of FIG. 8.

In operation 1120, in response to the signal NSLEEPIN, the inverter, i.e., 110, in each of the power gate circuits 100A-100D of FIG. 8 generates the input signal IN and transmits the input signal IN to the transistor M1 in a second layer below the first layer. In some embodiments, the transistor M1 in each of the power gate circuits 100A-100D is turned on in response to the input signal IN.

In operation 1130, when the transistor M1 of each of the power gate circuits 100A-100D is turned on, the power gate circuits 100A-100D receive the external voltage TVDD from the power rails 212 and 217 through the conductive lines 321, 323, 326, and 328 in a third layer below the second layer.

In operation 1140, after receiving the external voltage TVDD, the power gate circuits 100A-100B output the supply voltage VDD to the power rails 211, 213, 216, and 218 through the conductive lines 311, 312, 314, and 315. The power gate circuits 100C-100D output the supply voltage VDD to the power rails 211, 213, 216, and 218 through the conductive lines 311, 312, 314 and 315. In some embodiments, the power rails 211-218 are disposed in a fourth layer below the third layer.

Reference is now made to FIG. 12. FIG. 11 is a flow chart of a method 1200 of fabricating the integrated circuit 10 or 80, in accordance with various embodiments. It is understood that additional operations can be provided before, during, and after the processes shown by FIG. 12, and some of the operations described below can be replaced or eliminated, for additional embodiments of the method 1200. The method 1200 includes operations 1210-1260 that are described below with reference to FIG. 5A.

In operation 1210, the power rails 201-204 are formed in a first layer. The power rails 201-204 extend in the y-direction and are separated from each other in the x-direction. In some embodiments, the power rails 202-203 are coupled to the external voltage, i.e., TVDD or TVSS, which are by pins (not shown) disposed under and coupled the power rails 202-203.

In operation 1220, the conductive lines 301-305 are formed in a second layer above the first layer. The conductive lines 301-305 extend in the x-direction. In the embodiments shown in FIG. 5A, the conductive line 303 is coupled to the power rails 202-203, and the conductive lines 301 and 305 are coupled to the power rails 201 and 204.

In operation 1230, the conductive segments 501-513 are formed over a plurality of active areas 401-409 in a third layer above the second layer. The active area 401 is coupled to the conductive line 303 through the vias VM1 and VM5, and coupled to the conductive lines 301 and 305 through the vias VD3-VD4, and VD13-16.

In operation 1240, the gates 602-612 are formed to cross the active areas 401-109 and are interposed between the conductive segments 501-515.

In operation 1250, the conductive traces 701-706 are formed in a fourth layer above the third layer. The conductive traces 701-706 extend in the x-direction.

In operation 1260, the conductive pattern 801 is formed in a fifth layer above the fourth layer. The conductive pattern 801 extends in the y-direction and is coupled to two conductive traces 702 and 704.

Figure 13:
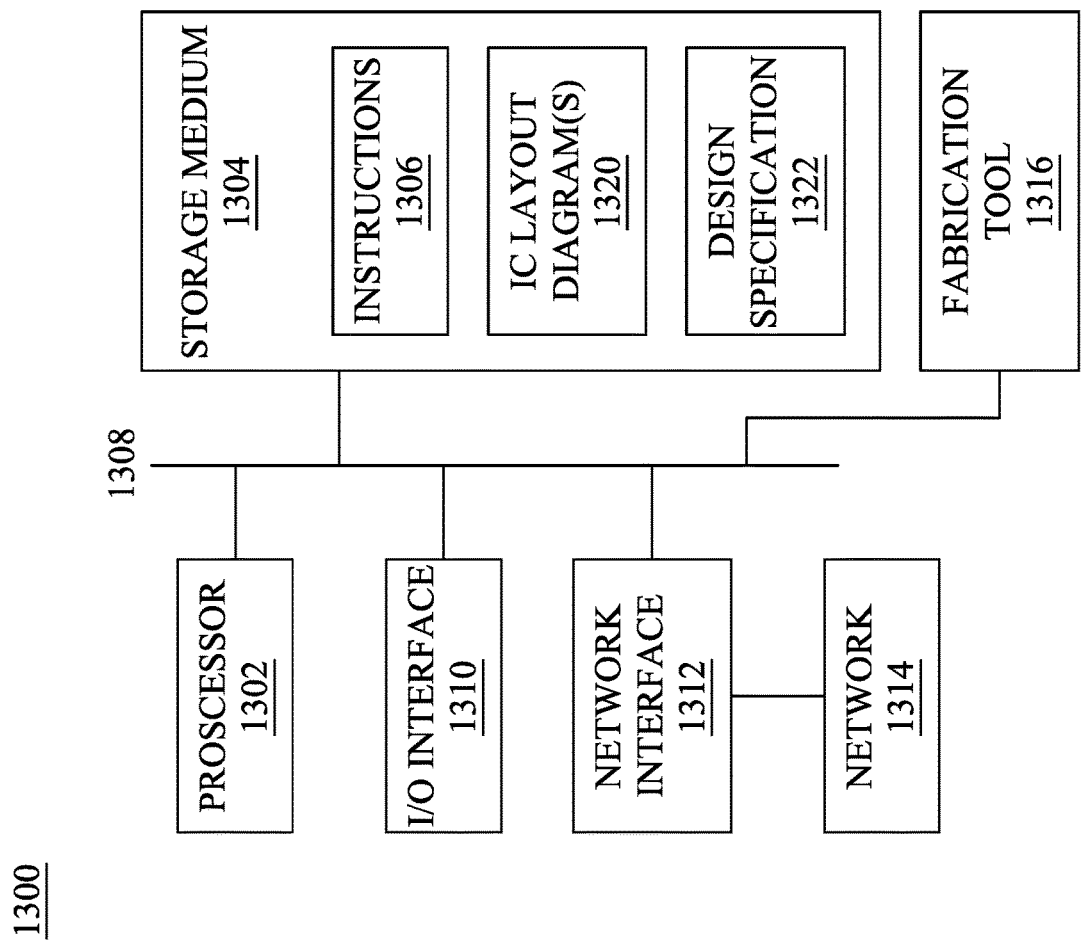
FIG. 13 is a block diagram of an integrated circuit device design system, in accordance with various embodiments.

Reference is now made to FIG. 13. FIG. 13 is a block diagram of an electronic design automation (EDA) system 1300 for designing the integrated circuit layout design, in accordance with some embodiments of the present disclosure. EDA system 1300 is configured to implement one or more operations of the methods 1100-1200 disclosed in FIGS. 11-12, and further explained in conjunction with FIGS. 1A-10. In some embodiments, EDA system 1300 includes an APR system.

In some embodiments, EDA system 1300 is a general purpose computing device including a hardware processor 1302 and a non-transitory, computer-readable storage medium 1304. Storage medium 1304, amongst other things, is encoded with, i.e., stores, computer program code (instructions) 1306, i.e., a set of executable instructions. Execution of instructions 1306 by hardware processor 1302 represents (at least in part) an EDA tool which implements a portion or all of, e.g., the method 1200.

The processor 1302 is electrically coupled to computer-readable storage medium 1304 via a bus 1308. The processor 1302 is also electrically coupled to an I/O interface 1310 and a fabrication tool 1316 by bus 1308. A network interface 1313 is also electrically connected to processor 1302 via bus 1308. Network interface 1313 is connected to a network 1314, so that processor 1302 and computer-readable storage medium 1304 are capable of connecting to external elements via network 1314. The processor 1302 is configured to execute computer program code 1306 encoded in computer-readable storage medium 1304 in order to cause EDA system 1300 to be usable for performing a portion or all of the noted processes and/or methods. In one or more embodiments, processor 1302 is a central processing unit (CPU), a multi-processor, a distributed processing system, an application specific integrated circuit (ASIC), and/or a suitable processing unit.

In one or more embodiments, computer-readable storage medium 1304 is an electronic, magnetic, optical, electromagnetic, infrared, and/or a semiconductor system (or apparatus or device). For example, computer-readable storage medium 1304 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1304 includes a compact disk-read only memory (CD-ROM), a compact disk-read/write (CD-R/W), and/or a digital video disc (DVD).

In one or more embodiments, storage medium 1304 stores computer program code 1306 configured to cause EDA system 1300 (where such execution represents (at least in part) the EDA tool) to be usable for performing a portion or all of the noted processes and/or methods. In one or more embodiments, storage medium 1304 also stores information which facilitates performing a portion or all of the noted processes and/or methods. In one or more embodiments, storage medium 1304 stores IC layout diagram 1320 of standard cells including such standard cells as disclosed herein, for example, cells corresponding to the multi-bit flip-flop circuits 31-36, 41-42, 61-63, 71-72, 91-93, and 101 discussed above with respect to FIGS. 1A-10.

EDA system 1300 includes I/O interface 1310. I/O interface 1310 is coupled to external circuitry. In one or more embodiments, I/O interface 1310 includes a keyboard, keypad, mouse, trackball, trackpad, touchscreen, and/or cursor direction keys for communicating information and commands to processor 1302.

EDA system 1300 also includes network interface 1313 coupled to processor 1302. Network interface 1313 allows EDA system 1300 to communicate with network 1314, to which one or more other computer systems are connected. Network interface 1313 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods are implemented in two or more systems 1300.

EDA system 1300 also includes the fabrication tool 1316 coupled to processor 1302. The fabrication tool 1316 is configured to fabricate integrated circuits, e.g., the integrated circuits 10 and 80 discussed above with respect to FIGS. 1A-10, according to the design files processed by the processor 1302.

EDA system 1300 is configured to receive information through I/O interface 1310. The information received through I/O interface 1310 includes one or more of instructions, data, design rules, libraries of standard cells, and/or other parameters for processing by processor 1302. The information is transferred to processor 1302 via bus 1308. EDA system 1300 is configured to receive information related to a UI through I/O interface 1310. The information is stored in computer-readable medium 1304 as design specification 1322.

In some embodiments, a portion or all of the noted processes and/or methods are implemented as a standalone software application for execution by a processor. In some embodiments, a portion or all of the noted processes and/or methods are implemented as a software application that is a part of an additional software application. In some embodiments, a portion or all of the noted processes and/or methods are implemented as a plug-in to a software application. In some embodiments, at least one of the noted processes and/or methods are implemented as a software application that is a portion of an EDA tool. In some embodiments, a portion or all of the noted processes and/or methods are implemented as a software application that is used by EDA system 1300. In some embodiments, a layout diagram which includes standard cells is generated using a suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, for example, one or more of an optical disk, such as a DVD, a magnetic disk, such as a hard disk, a semiconductor memory, such as a ROM, a RAM, a memory card, and the like.

Figure 14:
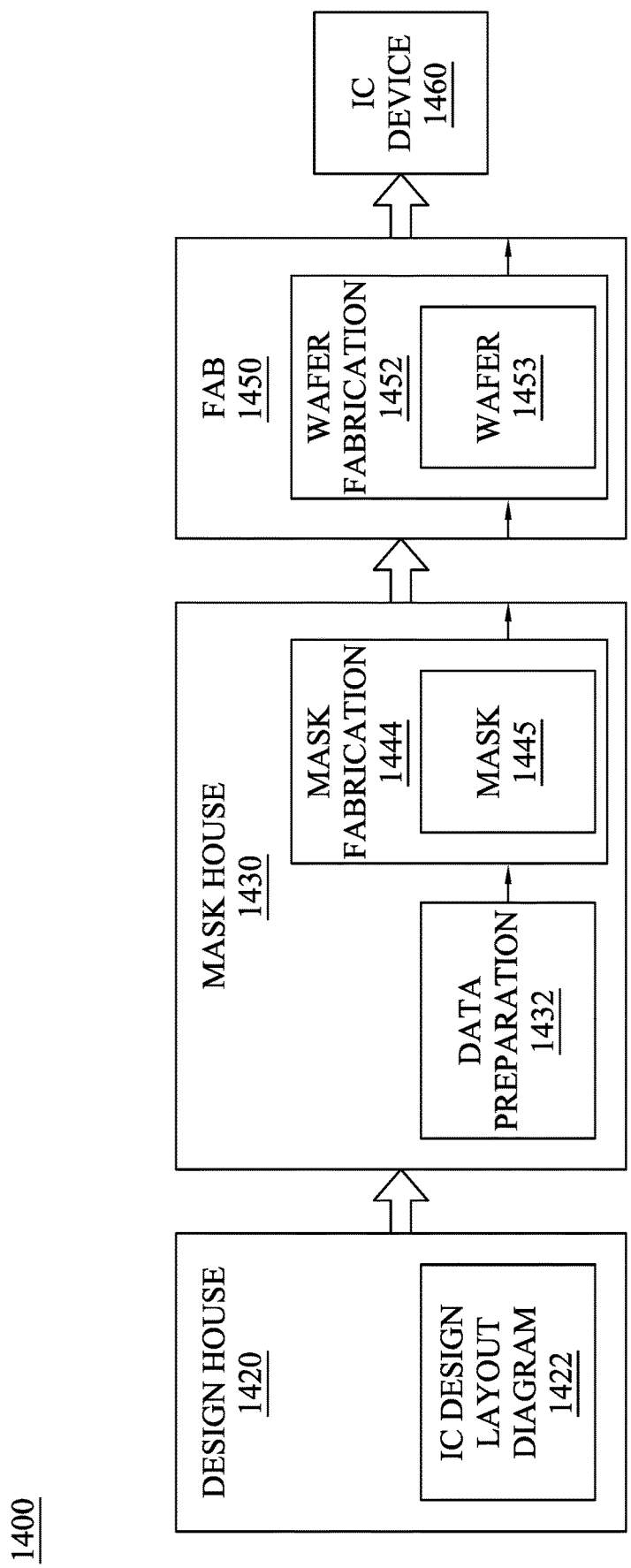
FIG. 14 is a block diagram of an integrated circuit manufacturing system, and an integrated circuit manufacturing flow associated therewith, in accordance with various embodiments.

FIG. 14 is a block diagram of IC manufacturing system 1400, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1400.

In FIG. 14, IC manufacturing system 1400 includes entities, such as a design house 1420, a mask house 1430, and an IC manufacturer/fabricator ("fab") 1450, that interact with one another in the design, development, and manufacturing cycles and/or services related to manufacturing an IC device 1460. The entities in IC manufacturing system 1400 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1420, mask house 1430, and IC fab 1450 is owned by a single entity. In some embodiments, two or more of design house 1420, mask house 1430, and IC fab 1450 coexist in a common facility and use common resources.

Design house (or design team) 1420 generates an IC design layout diagram 1422. IC design layout diagram 1422 includes various geometrical patterns, for example, an IC layout design depicted in FIGS. 3A-10, designed for an IC device 1460, for example, integrated circuits 100 and 700 discussed above with respect to FIGS. 3A-10. The geometrical patterns correspond to patterns of metal, oxide, or semiconductor layers that make up the various components of IC device 1460 to be fabricated. The various layers combine to form various IC features. For example, a portion of IC design layout diagram 1422 includes various IC features, such as an active region, gate electrode, source and drain, conductive segments or vias of an interlayer interconnection, to be formed in a semiconductor substrate (such as a silicon wafer) and various material layers disposed on the semiconductor substrate. Design house 1420 implements a proper design procedure to form IC design layout diagram 1422. The design procedure includes one or more of logic design, physical design or place and route. IC design layout diagram 1422 is presented in one or more data files having information of the geometrical patterns. For example, IC design layout diagram 1422 can be expressed in a GDSII file format or DFII file format.

Mask house 1430 includes data preparation 1432 and mask fabrication 1444. Mask house 1430 uses IC design layout diagram 1422 to manufacture one or more masks 1445 to be used for fabricating the various layers of IC device 1460 according to IC design layout diagram 1422. Mask house 1430 performs mask data preparation 1432, where IC design layout diagram 1422 is translated into a representative data file ("RDF"). Mask data preparation 1432 provides the RDF to mask fabrication 1444. Mask fabrication 1444 includes a mask writer. A mask writer converts the RDF to an image on a substrate, such as a mask (reticle) 1445 or a semiconductor wafer 1453. The IC design layout diagram 1422 is manipulated by mask data preparation 1432 to comply with particular characteristics of the mask writer and/or requirements of IC fab 1450. In FIG. 14, data preparation 1432 and mask fabrication 1444 are illustrated as separate elements. In some embodiments, data preparation 1432 and mask fabrication 1444 can be collectively referred to as mask data preparation.

In some embodiments, data preparation 1432 includes optical proximity correction (OPC) which uses lithography enhancement techniques to compensate for image errors, such as those that can arise from diffraction, interference, other process effects and the like. OPC adjusts IC design layout diagram 1422. In some embodiments, data preparation 1432 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, data preparation 1432 includes a mask rule checker (MRC) that checks the IC design layout diagram 1422 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1422 to compensate for limitations during mask fabrication 1444, which may undo part of the modifications performed by OPC in order to meet mask creation rules.

In some embodiments, data preparation 1432 includes lithography process checking (LPC) that simulates processing that will be implemented by IC fab 1450 to fabricate IC device 1460. LPC simulates this processing based on IC design layout diagram 1422 to create a simulated manufactured device, such as IC device 1460. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1422.

It should be understood that the above description of data preparation 1432 has been simplified for the purposes of clarity. In some embodiments, data preparation 1432 includes additional features such as a logic operation (LOP) to modify the IC design layout diagram 1422 according to manufacturing rules. Additionally, the processes applied to IC design layout diagram 1422 during data preparation 1432 may be executed in a variety of different orders.

After data preparation 1432 and during mask fabrication 1444, a mask 1445 or a group of masks 1445 are fabricated based on the modified IC design layout diagram 1422. In some embodiments, mask fabrication 1444 includes performing one or more lithographic exposures based on IC design layout diagram 1422. In some embodiments, an electron-beam (e-beam) or a mechanism of multiple e-beams is used to form a pattern on a mask (photomask or reticle) 1445 based on the modified IC design layout diagram 1422. Mask 1445 can be formed in various technologies. In some embodiments, mask 1445 is formed using binary technology. In some embodiments, a mask pattern includes opaque regions and transparent regions. A radiation beam, such as an ultraviolet (UV) beam, used to expose the image sensitive material layer (for example, photoresist) which has been coated on a wafer, is blocked by the opaque region and transmits through the transparent regions. In one example, a binary mask version of mask 1445 includes a transparent substrate (for example, fused quartz) and an opaque material (for example, chromium) coated in the opaque regions of the binary mask. In another example, mask 1445 is formed using a phase shift technology. In a phase shift mask (PSM) version of mask 1445, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1444 is used in a variety of processes. For example, such a mask(s) is used in an ion implantation process to form various doped regions in semiconductor wafer 1453, in an etching process to form various etching regions in semiconductor wafer 1453, and/or in other suitable processes.

IC fab 1450 includes wafer fabrication 1452. IC fab 1450 is an IC fabrication business that includes one or more manufacturing facilities for the fabrication of a variety of different IC products. In some embodiments, IC Fab 1450 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1450 uses mask(s) 1445 fabricated by mask house 1430 to fabricate IC device 1460. Thus, IC fab 1450 at least indirectly uses IC design layout diagram 1422 to fabricate IC device 1460. In some embodiments, semiconductor wafer 1453 is fabricated by IC fab 1450 using mask(s) 1445 to form IC device 1460. In some embodiments, the IC fabrication includes performing one or more lithographic exposures based at least indirectly on IC design layout diagram 1422. Semiconductor wafer 1453 includes a silicon substrate or other proper substrate having material layers formed thereon. Semiconductor wafer 1453 further includes one or more of various doped regions, dielectric features, multi-level interconnects, and the like (formed at subsequent manufacturing steps).

As discussed above, an integrated circuit of the present disclosure includes a power gate circuit disposed above a back-side power distribution network. By receiving and outputting voltages directly through power rails arranged below the power gate circuit, metal routing resource at the front side of the integrated circuit is saved for further connection. Accordingly, feasibility for the integrated circuit design is made.

In some embodiments, an integrated circuit is disclosed, including a first pair of power rails and a second pair of power rails that are disposed in a first layer and extend in a first direction; multiple conductive lines disposed in a second layer over the first layer, in which the conductive lines extend in a second direction different from the first direction and cross the first and second pairs of power rails; a first active area disposed in a third layer over the second layer and extending in the second direction, in which the first active area is arranged to overlap the first pair of power rails; and a first gate disposed over the first active area; and a conductive trace disposed over and coupled to the first gate. The first active area is coupled to the first pair of power rails through a first conductive line of the conductive lines and a first group of vias, and the first active area is coupled to the second pair of power rails through at least one second conductive line of the conductive lines and a second group of vias different from the first group of vias. In some embodiments, the first active area and the first gate are configured to be included in a transistor; and the conductive trace is configured to receive an input signal for the first gate. In some embodiments, the integrated circuit further includes a first pair of active areas and a second pair of active areas that extend in the second direction and are separated from each other in the first direction, in which the first pair of active areas and the second pair of active areas are disposed over the second pair of power rails; a second gate and a third gate that extend in the first direction; and a first conductive segment and a second conductive segment that extend in the first direction, in which the first conductive segment and the second gate cross the first pair of active areas, and the second conductive segment and the third gate cross the second pair of active area. In some embodiments, one of the first pair of active areas and one of the second pair of active areas that are adjacent to each other have a same conductivity type different from a conductivity type of the first active area. In some embodiments, power rails of the second pair of power rails are disposed on opposite sides of the first pair of power rails. In some embodiments, a length of the first conductive line of the conductive lines is shorter than that of the at least one second conductive line of the conductive lines, wherein the first conductive line is adjacent to the at least one second conductive line of the conductive lines. In some embodiments, the first active area includes multiple first active regions coupled to the first pair of power rails through the first group of vias; and multiple second active regions coupled to the second pair of power rails through the second group of vias. In some embodiments, the conductive lines further include a third conductive line aligning with and separated from the first conductive line of the conductive lines in the second direction.

Also disclosed is an integrated circuit that includes a first transistor and multiple conductive lines. The first transistor includes a first active area; multiple first conductive segments and multiple second conductive segments that are disposed in a first layer and above the first active area, in which the first conductive segments correspond to a source of the first transistor, and the second conductive segments correspond to a drain of the first transistor; and multiple first gates, corresponding to a gate of the first transistor, above the first active area and interposed between one of the first conductive segments and one of the second conductive segments. The plurality of conductive lines are disposed in a second layer below the first active area, in which the conductive lines include a first conductive line and multiple second conductive lines. In response to an input signal received at the gate of the first transistor, the source of the first transistor is coupled to an external voltage through the first conductive line, and the drain of the first transistor is coupled to a first supply voltage through the second conductive lines. In some embodiments, the integrated circuit further includes at least one first power rail and at least one second power rail that are disposed in a third layer below the second layer; in which the at least one first power rail transmits the external voltage to the first conductive line, and the at least one second power rails receives the first supply voltage from the second conductive lines. In some embodiments, the first conductive line crosses the at least one first power rail, and the second conductive lines cross the first conductive line and the at least one second power rail. In some embodiments, the first active area is configured to receive a current from the at least one first power rail through the conductive first line, and configured to output the current through the second conductive lines to the at least one second power rail. In some embodiments, the integrated circuit further includes a first inverter comprising a second transistor and a third transistor that have gates to receive a first signal, in which the second transistor includes a second active area overlapping one of the second conductive lines, and the third transistor includes a third active area; and a second inverter comprising a fourth transistor and a fifth transistor that have gates to receive the input signal, in which the fourth transistor includes a fourth active area overlapping another of the second conductive lines, and the fifth transistor includes a fifth active area. In some embodiments, the first, second, and fourth active areas have a first conductive type, and the third and fifth active areas have a second conductive type different from the first conductive type. In some embodiments, the conductive lines further includes a third conductive line; in which the third and fifth active areas overlap the third conductive line and is coupled to, through the third conductive line, a second supply voltage different from the first supply voltage.

Also disclosed is a method that includes operations: forming multiple power rails in a first layer, in which the power rails extend in a first direction and are separated from each other in a second direction; forming multiple conductive lines in a second layer over the first layer, in which the conductive lines extend in the second direction; forming multiple active areas in a third layer over the second layer; forming multiple conductive segments over the multiple active areas in the third layer, in which a first active area is coupled to a first conductive line and a second conductive line; forming multiple gates above the active areas and interposed between the conductive segments; forming multiple conductive traces in a fourth layer above the third layer, in which the conductive traces extend in the second direction; and forming a conductive pattern in a fifth layer above the fourth layer, in which the conductive pattern is coupled to the conductive traces. In some embodiments, forming the conductive lines includes coupling the first conductive line to a first power rail of the power rails; and coupling second conductive line to a second power rail of the power rails. In some embodiments, the first power rail is coupled to an external voltage, and the second power rail is coupled to a first supply voltage. In some embodiments, a length of the first conductive line is shorter than the second conductive line. In some embodiments, forming the power rails includes forming a first power rail coupled to a first external voltage; forming a first pair of power rails coupled to a first supply voltage and disposed on an opposite side of the first power rail; forming a second power rail coupled to a second external voltage; and forming a second pair of power rails coupled to a second supply voltage and disposed on the opposite side of the first power rail. A voltage level of the first external voltage is different from a voltage level of the second external voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
a first pair of power rails and a second pair of power rails that are disposed in a first layer and extend in a first direction;
a plurality of conductive lines disposed in a second layer over the first layer, wherein the plurality of conductive lines extend in a second direction different from the first direction and cross the first and second pairs of power rails;
a first active area disposed in a third layer over the second layer and extending in the second direction, wherein the first active area is arranged to overlap the first pair of power rails;
a first gate disposed over the first active area; and
a conductive trace disposed over and coupled to first gate, wherein the first active area is coupled to the first pair of power rails through a first line of the plurality of conductive lines and a first group of vias, and the first active area is coupled to the second pair of power rails through at least one second line of the plurality of conductive lines and a second group of vias different from the first group of vias.

2. The integrated circuit of claim 1, wherein the first active area and the first gate are configured to be included in a transistor, and wherein the conductive trace is configured to receive an input signal for the first gate.

3. The integrated circuit of claim 1, further comprising:
a first pair of active areas and a second pair of active areas that extend in the second direction and are separated from each other in the first direction, wherein the first pair of active areas and the second pair of active areas are disposed over the second pair of power rails;
a second gate and a third gate that extend in the first direction; and
a first conductive segment and a second conductive segment that extend in the first direction,
wherein the first conductive segment and the second gate cross the first pair of active areas, and the second conductive segment and the third gate cross the second pair of active area.

4. The integrated circuit of claim 3, wherein one of the first pair of active areas and one of the second pair of active areas that are adjacent to each other have a same conductivity type different from a conductivity type of the first active area.

5. The integrated circuit of claim 1, wherein power rails of the second pair of power rails are disposed on opposite sides of the first pair of power rails.

6. The integrated circuit of claim 1, wherein a length of the first line of the plurality of conductive lines is shorter than that of the at least one second line of the plurality of conductive lines, wherein the first line is adjacent to the at least one second line of the plurality of conductive lines.

7. The integrated circuit of claim 1, wherein the first active area comprises:
a plurality of first active regions coupled to the first pair of power rails through the first group of vias; and
a plurality of second active regions coupled to the second pair of power rails through the second group of vias.

8. The integrated circuit of claim 1, wherein the plurality of conductive lines further comprise a third conductive line aligning with and separated from the first line of the plurality of conductive lines in the second direction.

9. An integrated circuit, comprising:
a first transistor, comprising:
a first active area;
a plurality of first conductive segments and a plurality of second conductive segments that are disposed in a first layer and above the first active area, wherein the plurality of first conductive segments correspond to a source of the first transistor, and the plurality of second conductive segments correspond to a drain of the first transistor; and
a plurality of first gates, corresponding to a gate of the first transistor, above the first active area and interposed between one of the plurality of first conductive segments and one of the plurality of second conductive segments; and
a plurality of conductive lines disposed in a second layer below the first active area, wherein the plurality of conductive lines include a first conductive line and a plurality of second conductive lines;
wherein in response to an input signal received at the gate of the first transistor, the source of the first transistor is coupled to an external voltage through the first conductive line, and the drain of the first transistor is coupled to a first supply voltage through the plurality of second conductive lines.

10. The integrated circuit of claim 9, further comprising:
at least one first power rail and at least one second power rail that are disposed in a third layer below the second layer,
wherein the at least one first power rail transmits the external voltage to the first conductive line, and the at least one second power rails receives the first supply voltage from the plurality of second conductive lines.

11. The integrated circuit of claim 10, wherein the first conductive line crosses the at least one first power rail, and the plurality of second conductive lines cross the first conductive line and the at least one second power rail.

12. The integrated circuit of claim 10, wherein the first active area is configured to receive a current from the at least one first power rail through the first conductive line and configured to output the current through the plurality of second conductive lines to the at least one second power rail.

13. The integrated circuit of claim 9, further comprising:
a first inverter comprising a second transistor and a third transistor that have gates to receive a first signal, wherein the second transistor includes a second active area overlapping one of the plurality of second conductive lines, and the third transistor includes a third active area; and
a second inverter comprising a fourth transistor and a fifth transistor that have gates to receive the input signal, wherein the fourth transistor includes a fourth active area overlapping another of the plurality of second conductive lines, and the fifth transistor includes a fifth active area.

14. The integrated circuit of claim 13, wherein the first, second, and fourth active areas have a first conductive type, and the third and fifth active areas have a second conductive type different from the first conductive type.

15. The integrated circuit of claim 13, wherein the plurality of conductive lines further includes a third conductive line;
wherein the third and fifth active areas overlap the third conductive line and is coupled to, through the third conductive line, a second supply voltage different from the first supply voltage.

16. An integrated circuit, comprising:
a first plurality of power rails and a second plurality of power rails in a first metallization layer and extending in a first direction;
a plurality of conductive lines in a second metallization layer above the first and second pluralities of power rails and extending in a second direction; and
a transistor above the plurality of conductive lines, wherein the transistor comprises:
an active area that overlaps the first plurality of power rails and extends in the second direction, wherein the active area is electrically coupled to the first plurality of power rails through a first conductive line of the plurality of conductive lines and a first via, and wherein the active area is electrically coupled to the second plurality of power rails through a second conductive line of the plurality of conductive lines and a second via.

17. The integrated circuit of claim 16, further comprising a conductive trace above the active area and electrically coupled to the transistor.

18. The integrated circuit of claim 16, wherein the second plurality of power rails are disposed on an opposite side to the first plurality of power rails.

19. The integrated circuit of claim 16, wherein the first conductive line is shorter than the second conductive line, and wherein the first conductive line is adjacent to the second conductive line.

20. The integrated circuit of claim 16, wherein the plurality of conductive lines comprises a third conductive line aligned with and separated from the first conductive line.

* * * * *